United States Patent [19]

Yukutake et al.

[11] Patent Number: 5,523,713

[45] Date of Patent: Jun. 4, 1996

[54] MULTIPLEX CIRCUIT ARRANGEMENT FOR USE WITH A SEMICONDUCTOR INTEGRATED CIRCUIT

[75] Inventors: Seigoh Yukutake, Hitachi; Yutaka Kobayashi, Katsuta; Takashi Akioka; Masahiro Iwamura, both of Hitachi, all of Japan

[73] Assignee: Hitachi, Ltd., Tokyo, Japan

[21] Appl. No.: 464,344

[22] Filed: Jun. 5, 1995

Related U.S. Application Data

[62] Division of Ser. No. 325,116, Oct. 18, 1994, which is a continuation of Ser. No. 793,652, Nov. 18, 1991, abandoned.

[30] Foreign Application Priority Data

Nov. 19, 1990 [JP] Japan .................................. 2-311502
Mar. 20, 1991 [JP] Japan .................................. 3-057089

[51] Int. Cl.$^6$ ............................................. H03K 17/62
[52] U.S. Cl. ........................................... 327/411; 327/407
[58] Field of Search ...................... 365/189.02, 230.02; 327/403, 404, 405, 407, 411, 408, 478

[56] References Cited

U.S. PATENT DOCUMENTS

| | | | |
|---|---|---|---|
| 3,638,131 | 1/1972 | Sarkissian | 327/411 |
| 3,953,839 | 4/1976 | Dennison et al. | 307/238 |
| 4,147,943 | 4/1979 | Peterson | 307/355 |
| 4,651,033 | 3/1987 | Yasutake et al. | 307/355 |
| 4,668,881 | 5/1987 | Piasecki | 307/355 |
| 4,883,987 | 11/1989 | Fattaruso | 307/355 |
| 4,932,027 | 6/1990 | Scharrer | 327/408 |
| 4,984,196 | 1/1991 | Tran et al. | 365/51 |
| 5,122,689 | 6/1992 | Barre | 307/475 |
| 5,144,164 | 9/1992 | Sugimoto et al. | 307/355 |
| 5,289,048 | 2/1994 | Ishihara et al. | 327/407 |
| 5,298,810 | 3/1994 | Scott et al. | 327/407 |
| 5,331,206 | 7/1994 | Liron | 327/403 |
| 5,465,061 | 11/1995 | Dufour | 327/403 |

FOREIGN PATENT DOCUMENTS

| | | |
|---|---|---|
| 2-64992 | 3/1990 | Japan . |
| 2-244491 | 9/1990 | Japan . |

*Primary Examiner*—Timothy P. Callahan
*Assistant Examiner*—Toan Tran
*Attorney, Agent, or Firm*—Antonelli, Terry, Stout & Kraus

[57] ABSTRACT

A multiplex circuit is disclosed in which a plurality of bipolar transistors are combined and in which the respective base terminals thereof are used as inputs, thereby to construct an emitter follower type multiplex circuit. In such an emitter follower type multiplex circuit, the multiplexing function of non-selection/selection is effected by controlling the base potential of the respective bipolar transistors by providing a MOS transistor between each base and a high potential of the power source through a resistor and a current drawing circuit. In accordance with such a scheme, when a selection of one input signal is made, the bipolar transistor corresponding thereto is permitted to turn ON on the basis of an input signal supplied to the base terminal thereof. The bipolar transistors corresponding to the non-selection input signals are maintained OFF, through activating the current drawing circuits associated therewith, irrespective of the potential levels of the incoming input signals supplied to the base terminals thereof. In the emitter follower type multiplex circuit, a constant current source is also provided between the commonly connected emitters of the bipolar transistors and the power source of low potential. The multiplex arrangement effected can be of the collector dot type multiplex circuit. Such multiplex circuits are used with a semiconductor integrated circuit such as a memory circuit.

24 Claims, 25 Drawing Sheets

F I G. 4  F I G. 5  F I G. 6
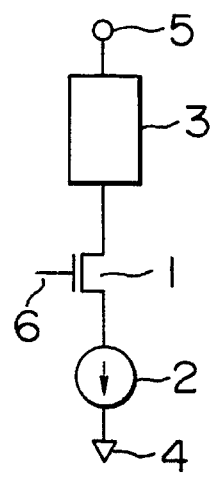
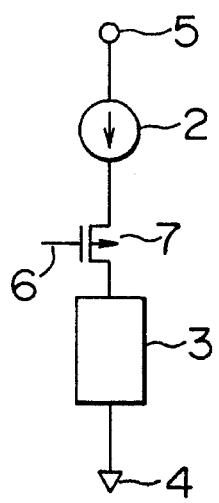
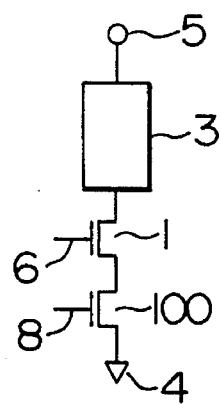
F I G. 7
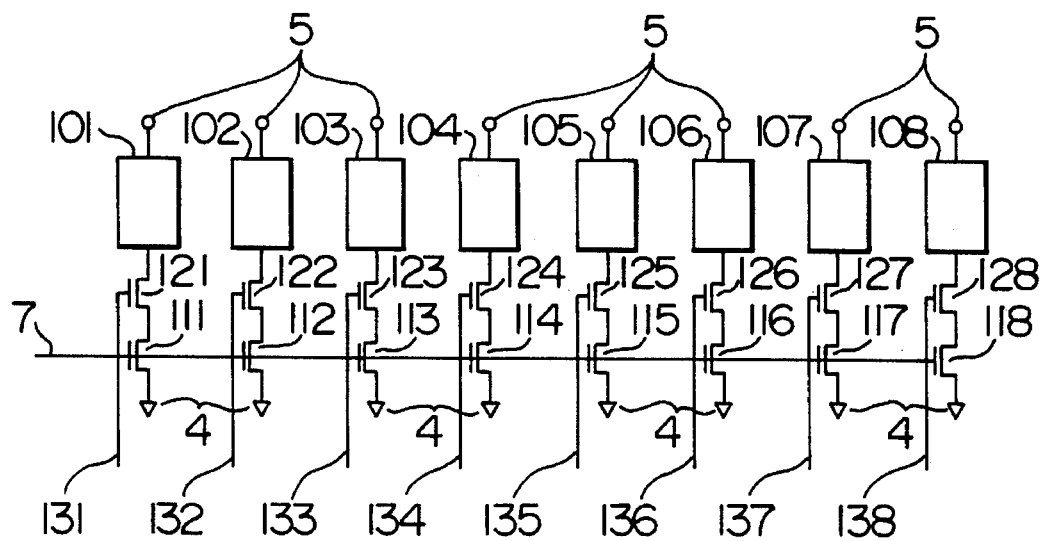

F I G. 12
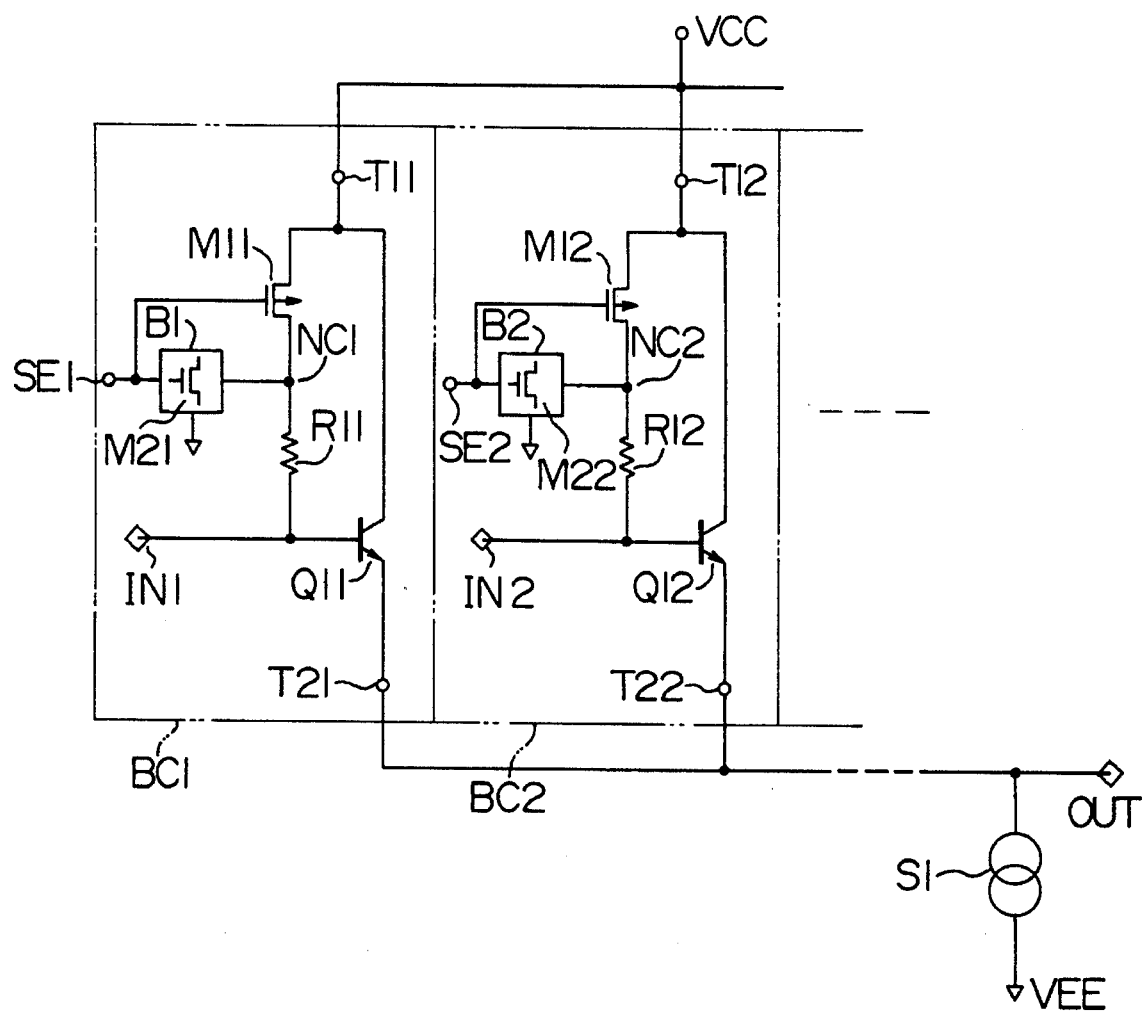

F I G. 14
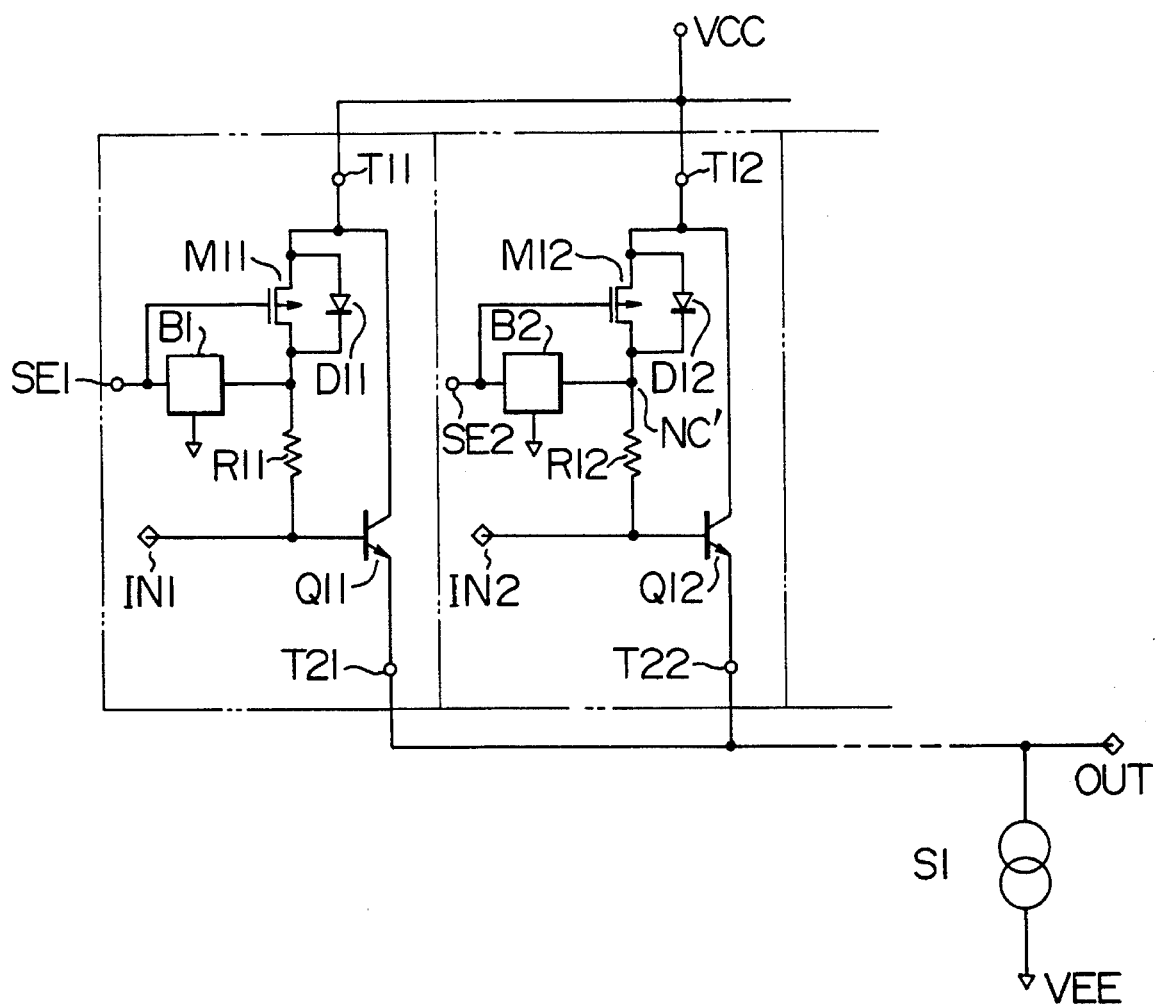

F I G. 16
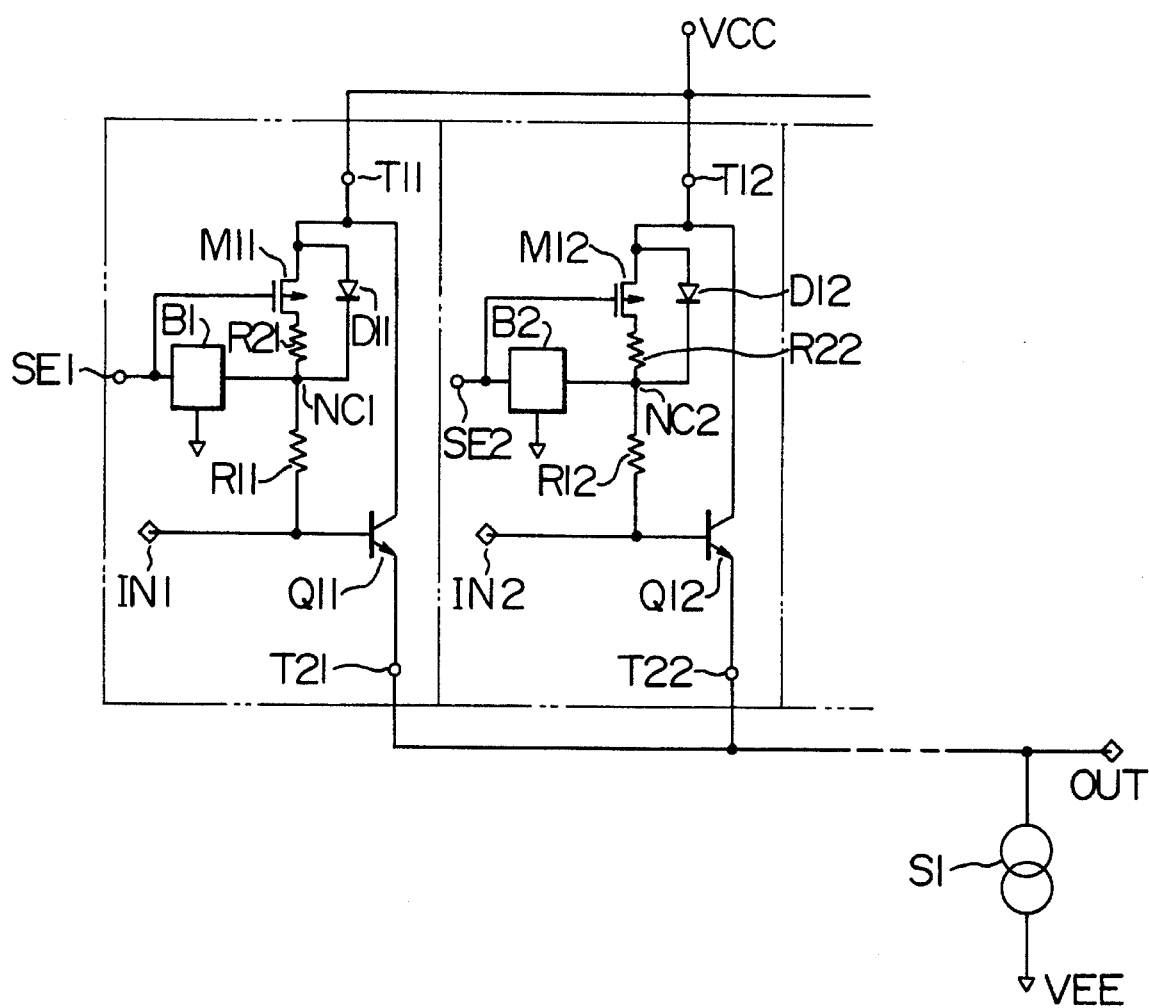

F I G. 17
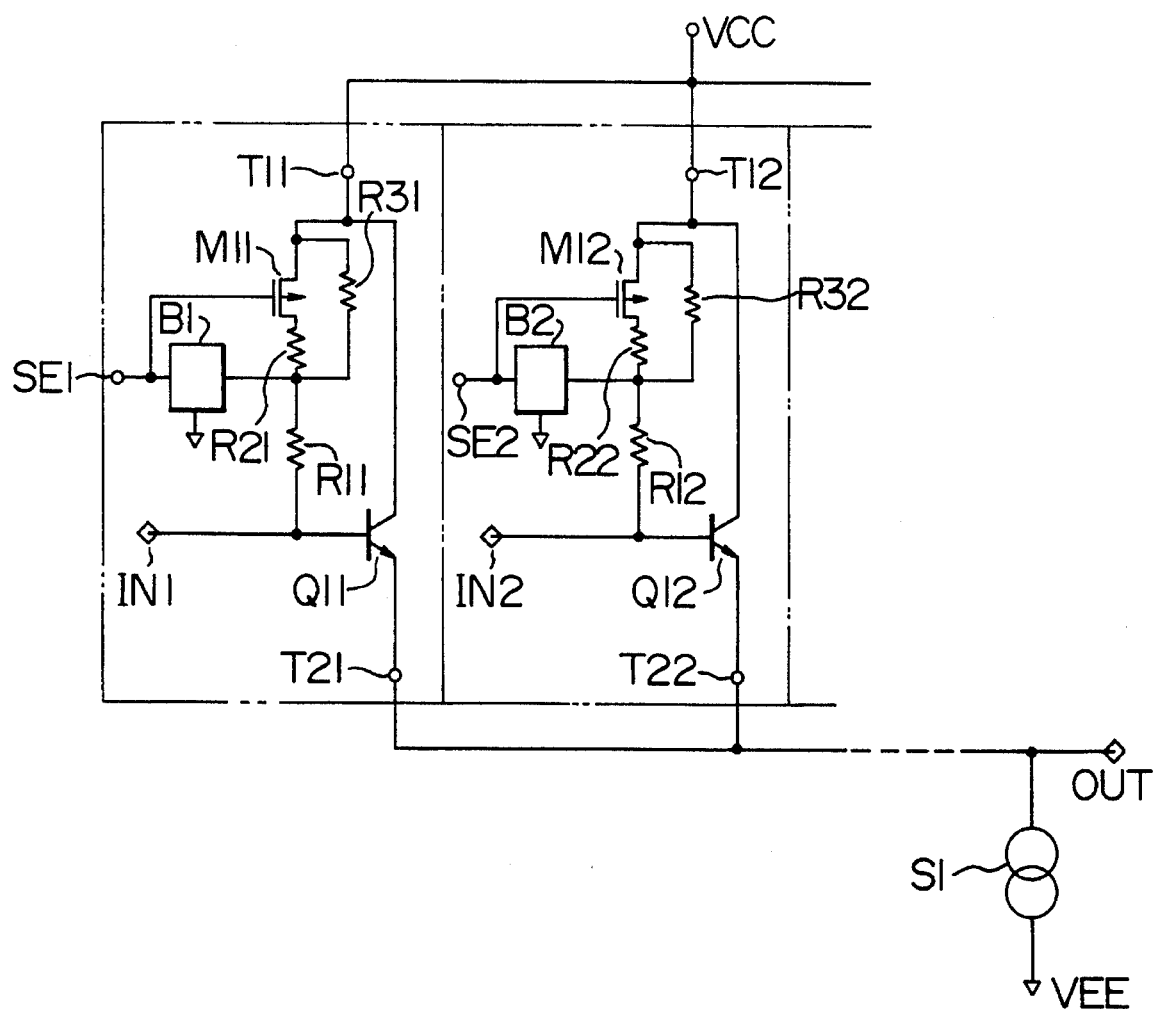

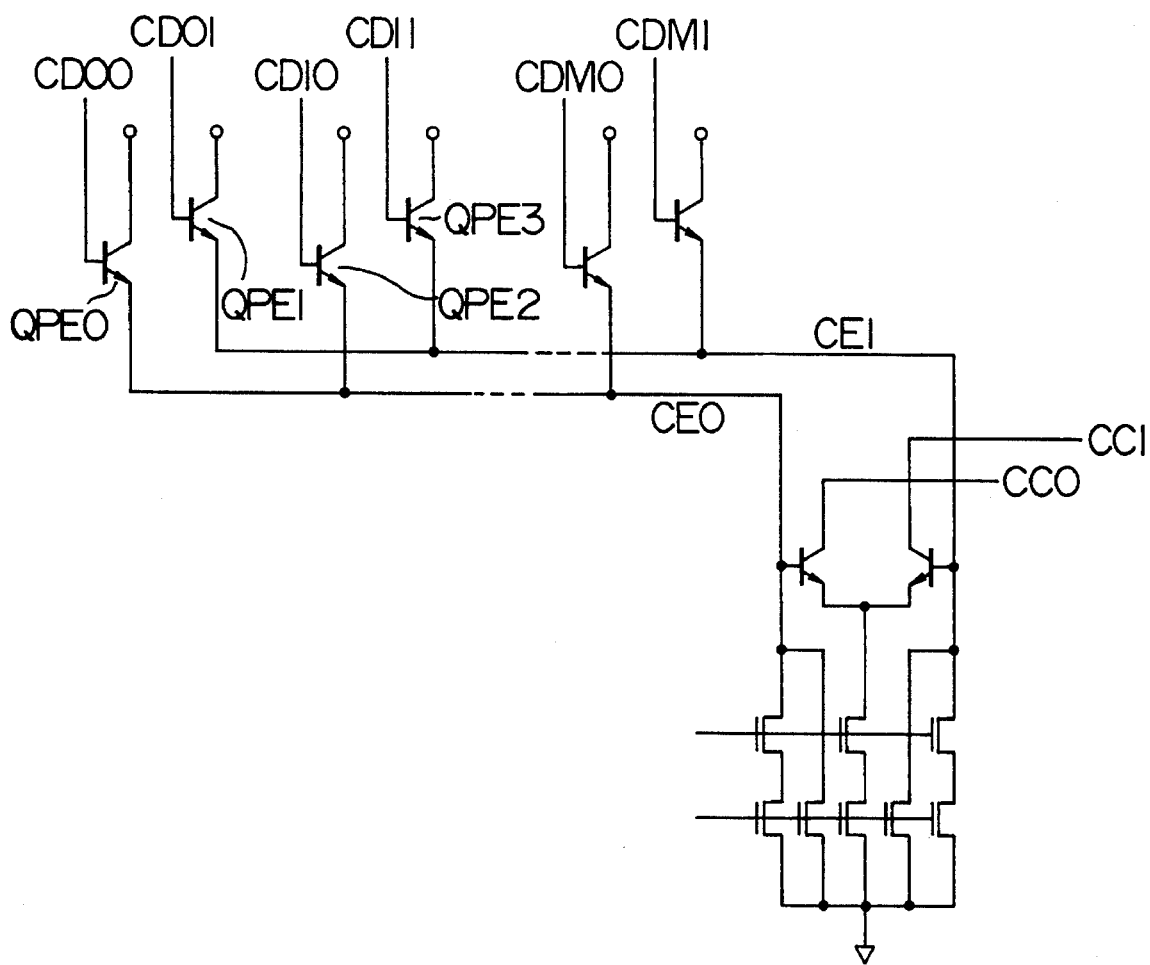
F I G. 30

MULTIPLEX CIRCUIT ARRANGEMENT FOR USE WITH A SEMICONDUCTOR INTEGRATED CIRCUIT

This is a divisional of application Ser. No. 08/325,116, filed Oct. 18, 1994; which is a continuation of application Ser. No. 07/793,652, filed Nov. 18, 1991, now abandoned.

BACKGROUND OF THE INVENTION

The present invention relates to a memory circuit and, more particularly, to a memory circuit which has electrical characteristics independent of the change of a source voltage and in which a signal delay due to wiring is reduced.

In attempting to facilitate improvements of memory circuits, various kinds of electrical characteristics have been considered over the years, such as the lowering of an operating voltage of a semiconductor memory to enhance the memory storage capacity and the battery driving to be readily realized.

One procedure of the improvements is to have electrical characteristics independent of the change of a source voltage or an ambient temperature. Another procedure thereof is to reduce a signal delay due to wiring when providing a large memory storage capacity.

The description hereinbelow will be directed to a current source circuit, of a prior art scheme, used in a selection circuit of a sense amplifier circuit used in a static random access memory (SRAM), for discussing the relative change of characteristics thereof to the change of a source voltage. In FIG. 4 shown in JP-A-64922 there is shown an electrical arrangement in which a current source for driving a current amplifier is constructed of an NMOS transistor of which the gate terminal thereof is controlled by a selection signal from a decoder circuit.

The description will hereinbelow be given with respect to the operation of a current source, providing a controllable current, for selecting a memory row which is used in a sense amplifier of a SRAM, such as shown in FIG. 1.

In FIG. 1, numeral 10 designates three MOS transistors each constituting a current source, and numeral 11 designates an input terminal for a signal used for activating the MOS transistors (MOSFETs) 10 and a circuit driven by the MOS transistors 10. Numeral 12 designates a pair of bipolar transistors together constituting a bipolar transistor type differential sense amplifier, the reference numeral 14 designates bipolar transistors configured as emitter followers and reference numeral 13 designates diode-configured bipolar transistors which operate in conjunction with transistors 14 as a level shift circuit for converting a level of a read signal from a memory cell.

Numeral 15 designates a data bus line (e.g., a pair of complementary lines) to which the collectors of the bipolar transistors 12 are connected in common therewith (hereinafter, referred to as "a common collector line", when applicable), and numeral 16 designates a P-channel MOS (PMOS) transistor for adjusting a level of a data bus. Numeral 17 designates a data bus line (hereinafter, referred to as "common data line", when applicable) used for selecting data from one pair of a plurality of pairs of data lines 19 to transfer the selected one to a sense amplifier, and numeral 18 designates a transfer MOS transistor for selecting one pair of data lines 19 including a memory cell holding the data to be outputted to the common data line 17 (hereinafter, referred to as "a Y switch MOS transistor", when applicable). Numeral 19 designates the data line, numeral 20 designates a word line for inputting therethrough a signal used for selecting one memory cell from a plurality of memory cells connected to one pair of data lines, and numeral 21 designates a memory cell (in the figure, although only one memory cell is shown, practically the memory cells having the number of 128 to 1024 or so are connected to the same pair of data lines). Numeral 22 designates a PMOS transistor for a data line load which is turned off when writing data to the memory cell, and numeral 23 designates a PMOS transistor for a data line load which is normally turned on. Numeral 24 designates a signal terminal which is made to go to "high" in the writing operation thereby to turn the PMOS transistor 22 off, and numeral 25 designates a Y switch signal input terminal used for selecting the Y switch MOS transistor 18. Numeral 26 designates a Y switch terminal used for selecting a Y switch MOS transistor which is shown at the right end in FIG. 1 from the plurality of data lines connected to the common data line 17, and numeral 27 designates the Y switch MOS transistor. Numeral 28 designates wirings of other pairs of Y switch MOS transistors which are not shown in the figure but are connected to the common data lines 17, and numeral 29 designates a bipolar transistor used for shortening a period of time required for the sensing operation and for realizing a high speed operation by reducing the amplitude of the signal on the common collector line.

Numeral 30 designates a constant current source for applying a bias current to the emitter of the bipolar transistor 29, and numeral 31 designates a constant current source for applying a bias voltage to the base of the bipolar transistor 29. Numeral 34 designates a resistor for generating an output amplitude of a sense amplifier stage, and numeral 35 designates a resistor for supplying a base bias of the bipolar transistor 29. Numeral 36 designates an output terminal (e.g., a pair of complementary output terminals) of the sense amplifier stage, and numeral 37 designates a memory block which has a number of memory cells connected to the same sense amplifiers. Moreover, numeral 38 represents a power source terminal and numeral 39 represents the ground terminal.

The operation will subsequently be described. For the operation of reading out data from the memory cell, it is necessary to select the memory row including the memory cell which holds the data to be outputted on the data bus lines (i.e., the common collector lines 15). In the circuit shown in FIG. 1, the operation of selecting the data in the memory row is realized by operating the current source for driving the sense amplifier. That is, in the case shown in FIG. 1, the memory row is selected by turning the MOS transistors 10 constituting the current source on.

The problem inherent in the current source selection method employed in the above-mentioned prior art sense amplifier is that the electrical characteristics largely depend on the power source voltage. Since in the above example, the MOS transistors 10 are driven by a CMOS logic circuit, the selection signal having substantially the same amplitude (the amplitude of the CMOS logical level) as that of the power source voltage is applied to the gate terminal 11. When the power source voltage applied to the semiconductor apparatus is raised or lowered in accordance with the change of the external conditions, the gate voltage of the MOS transistor 10 is changed along therewith to vary the magnitude of the current generated by the current source. Since generally, the change in current level of a MOS transistor is approximately proportional to a change of the gate bias voltage squared, that change becomes large. However, such a large change in current level is not desirable from a point of view of the stability of the circuit performance to the external power source voltage.

As shown in the above example, in an electric circuit, generally, such a current is required in some cases to be substantially zero in the off period and constant in the on period, independently of the external conditions such as the power source voltage of the apparatus, the ambient temperature and the change of the device characteristics due to the variations in the process.

Moreover, signal delay due to the wiring becomes a problem as the storage capacity of the memory is increased.

When the storage capacity of the memory is increased, as shown in FIG. 2, the output signals of sense amplifiers PS1 and PS2 in a first stage are transferred through data bus lines CC1 and CC2 of several mm length. A data bus line becomes increased in length as the level of integration is increased, and the width thereof becomes narrowed as the degree of scale down is advanced. Therefore, the resistance of the wiring of the data bus line is increased. In a similar manner, when the pitch of the data bus line is decreased, the capacitance between the wirings is also increased. As described above, the wiring resistance and the wiring capacitance are increased. Therefore, since the delay of the signal line is increased, the high integration and the high speed performance cannot be attained at the same time. As a method of solving this problem, hitherto, there is known an example in which a data bus line is divided by a data multiplexer which employs a multi-emitter and is disclosed in JP-A- 2-244491 to divide a resistance and a capacitance, thereby to attain the high integration and the high speed performance simultaneously.

The prior art data multiplexer employing the multi-emitter has the disadvantage in which when the power source voltage becomes less than 3.3 V, the normal operation cannot be obtained. That reason will now be described when applying the improved construction of the current source circuit to the general multiplexer circuit shown in FIG. 3. In a circuit shown in FIG. 3, the voltage drop across MP1 and MP2, serving as a current source as well as a selection logic circuit, is about 1 V, the voltage drop across each of QP1 and QP2 is about 0.8 V, and voltage drop across each of QME1 and QME2 is about 0.8 V. Further, since load resistors are provided between the collectors of QME1 and QME2 and VCCL, the output voltage amplitude occurs in each of the collectors and the voltage drop of about 0.8 V is developed thereacross. Therefore, the total voltage drop between the potential at the VCCL terminal and the ground potential through QME1, QP2, MP1 and MP2 is 3.4 V. As a result, in the prior art multiplexer circuit, the operation at the source voltage of 3.3 V cannot be performed. Further, in an LSI of high integration, it is required to provide a multiplex in a hierarchical manner. However, in the prior art multiplexer, such an arrangement cannot be realized.

SUMMARY OF THE INVENTION

It is therefore a principal object of the present invention to provide a memory circuit improved in electrical characteristics.

It is a second object of the present invention to provide a memory circuit having electrical characteristics independent of the change of a source voltage.

It is a third object of the present invention to provide a large capacity-memory device in which signal delay due to changes in the wiring length is prevented.

It is a fourth object of the present invention to provide a large capacity-memory device which is capable of being operated with a low source voltage.

In order to attain, especially, the above-described second object of the present invention, as it relates to the above-mentioned current source, a constant current source and a field effect transistor connected in series to the constant current source are employed.

A signal used for controlling the current source is applied to a gate terminal of the field effect transistor. Alternatively, there may be used a signal the absolute value of the amplitude of which is varied due to the change of the source voltage such as an output signal of a CMOS logic circuit. By the constant current source, it does not mean a current source wherein the absolute value of the current is always exactly constant. That is, it means to set characteristics of a constant current source and a circuit operated by the constant current source in such a way as to be able to neglect the dependency of performance of the whole circuitry to a change in external conditions, such as the source voltage, the ambient temperature and the process conditions.

In other words, for example, in the case where a circuit employing a current source is a bipolar transistor type differential amplifier which employs resistors as its loads, there may occur changes due to the variations in the resistance values of the resistors and the temperature change. Therefore, if the current value of the current source is perfectly maintained constant, the amplitude of the output voltage of the differential amplifier is changed in accordance with those external conditions. In this case, the current value of the constant current source is set so as to be changed in accordance with the external conditions. That is, the current value of the constant current source is set in such a way that when the resistance values vary widely, the current value becomes small, while when the resistance values vary narrowly, the current value becomes large.

By the provision of such an arrangement, it is possible to eliminate the dependency of performance of the whole circuitry including the current source of the present invention to those external conditions. That is, in the example as described above, the amplitude of the output voltage of the differential amplifier made up of bipolar transistors can be maintained constant independently of the changes of those external conditions. Moreover, it is possible to eliminate the dependency of performance of the circuit to those external conditions.

In order to attain the third and fourth objects mentioned above, the present invention is characterized such that only one junction of a bipolar transistor across which the voltage drop is developed is effected between a high potential power source and a low potential power source and that a load resistor between a collector of the bipolar transistor and the high potential power source is removed. More specifically, the present invention provides for a plurality of emitter follower circuits which are combined with one another so that the respective bases thereof are used as inputs, thereby to construct an emitter follower type multiplex circuit in which the respective emitters thereof are also connected to one another. In this emitter follower type multiplex circuit, the multiplexing function of non-selection/selection is realized by controlling the base potential. The control of the base potential is performed in such a way that a MOS transistor is provided between the base and a high potential power source node through a resistor. In accordance with such an arrangement, a MOS transistor corresponding to the base which is to be selected is turned on to thereby connect the corresponding base to the high potential power source node while a MOS transistor corresponding to the base which is not to be selected is turned off to thereby electrically isolate the corresponding base, and the base potential is lowered by current drawing circuit means.

It is important that the potential of the base which is to be non-selective is maintained more than a setting level so as not to be lowered too much, and the switching of the base potential to a selection level is performed at a high speed. Therefore, the present invention may provide that a second resistor and a diode are provided in the forward direction in parallel with the MOS transistor provided between the base and the high potential power source node through the first resistor, thereby to perform the clamping operation.

Further, the present invention may also provide that as means for reducing the change (e.g., change in amplitude) of the base potential in the selection/non-selection state, a MOS transistor and a third resistor are provided in series between the base and the high potential node through the first resistor, a second resistor is provided in parallel with the MOS transistor and the third resistor connected in series, and the effective load resistance value between the high potential power source node and the base in the selection state is set to a value near that therebetween in the non-selection state.

Moreover, the present invention may also provide that as the current drawing circuit means, a drawing MOS transistor is provided at least between the base and a low potential power source node and a circuit is provided which is operated in such a way as to turn on the MOS transistor corresponding to the base of a transistor which is to be non-selected to electrically connect that MOS transistor to the low potential power source node, and to turn off the MOS transistor corresponding to the base of a transistor which is to be selected to electrically isolate that MOS transistor.

Further, as means for reducing a steady-state current in drawing the current, an arrangement may be employed in which at least two or more current source means are connected in series, one current source means being used as a constant current source and the other current source means being used as a switching i.e. a circuit which is switched on/off by a control signal (e.g. non-selection/selection).

Furthermore, such an arrangement may be also employed that as means for eliminating a steady-state current in the non-selection when drawing the current, at least two current drawing MOS transistors are connected in series to one another. The gate of one such MOS transistor is connected to an output of an inverter circuit the input of which is connected to a gate of the other one of such MOS transistors and to a control signal, thereby to construct a circuit for drawing a current only during the delay time of the inverter circuit at the moment when the operation is switched from the selection state to the non-selection state.

As multiplex means other than an emitter follower type multiplex circuit, there is known a collector dot type multiplex circuit.

With the applications of a memory LSI, a microprocessor and the like, by combining the above-mentioned means, the present invention can cope with various kinds of application and suitable effects can be obtained.

The description will hereinbelow be given with respect to the functions of the above-mentioned technical means. Since the emitter follower type multiplex circuit of the present invention is only provided with one bipolar transistor and a current source circuit between the high potential power source and the low potential power source, its operating voltage is the sum of the voltage drop (about 0.8 V) across the base and emitter of the bipolar transistor and the voltage drop (about 1.0 V) across the current source. Thus, even if the power source voltage is lowered to about 2.0 V, the multiplex circuit can be operated. This operational feature also conforms to a collector dot type multiplex circuit. Moreover, in the emitter follower type multiplex circuit, the level of the input voltage is "High" and that of the output voltage is "Low", while in the collector dot type multiplex circuit, the level of the input voltage is "Low", and that of the output voltage is "High". Therefore, since with those circuits, one circuit can be used as an input circuit or an output circuit of the other circuit, it is possible to arrange a multiplex in a hierarchical manner.

Subsequently, the description will be given with respect to the functions of a base voltage control circuit in which that emitter follower type multiplex circuit is realized. The selection of data is performed by control of the base voltage. In this connection, the present invention may provide that the control of the base voltage is performed in such a way that the MOS transistor is provided between the base and the high potential power source node through the resistor, the MOS transistor corresponding to the base of the transistor to be selected is turned on to electrically connect that MOS transistor to the high potential power source node, while the MOS transistor corresponding to the base of the transistor to be non-selected is turned off to be electrically isolated, and the base voltage is lowered by the current drawing circuit means. In this circuit, if the control of the base voltage is performed in such a way that the MOS transistor provided between the high potential power source and the base is turned on, and the base potential drawing circuit is turned off, the input signal becomes an input voltage and this signal will be outputted to the emitter. Moreover, if the MOS transistor is turned off and the base potential drawing circuit is turned on, the base potential is maintained at a low potential and the input signal is not outputted to the emitter. This operation allows the data to be selected. This method may provide that since the non-selection operation is carried out by drawing electric charge accumulated in the base, it is possible to realize the emitter follower type multiplex circuit without causing the steady-state current to flow from the high potential power source in the non-selection state.

If the base potential in the non-selection operation state is lowered too much, the delay time required for the base potential to be raised up to the selection level when switching the operation to the selection state becomes large. Then, it is necessary to maintain the base potential at a fixed level or more to reduce the delay time required for the base potential to be raised up to the selection level. Therefore, if the diode and the resistor are provided in parallel with the MOS transistor, since the voltage applied across the diode is set to Vbe or less in the selection, the diode is not operated. In the non-selection operation state, however, since the high potential power source is electrically isolated from the base and the drawing circuit is turned on, the voltage applied across the diode is increased up to Vbe. When Vbe is applied across the diode, the diode is turned on. Thus, even if the potential of the base is lowered at the time of non-selection operation state, the base potential is clamped by the diode. Therefore, the base potential is not lowered to a certain level or less.

By reducing the change of the base potential in the selection and the non-selection operation state, the base potential can be switched over to the setting level at a high speed, in correspondence to the switching of the selection or the non-selection. In order to reduce the change of the base potential, the value of the effective load resistance between the high potential power source node and the base is set to a large value in the non-selection state as compared with the case of the selection and the difference therebetween is reduced, thereby to enable the change of the base potential to be reduced.

When the above clamping diode and the like are used, the clamping diode is operated in the non-selection state, and the current is caused to flow through that diode and the current drawing circuit means. In order to reduce that current, the electric charge accumulated in the base is drawn at a stretch by the current drawing circuit means at the moment when the operation is switched over from the selection state to the non-selection state, thereby to make the base potential to be raised up to the non-selection level at a high speed. Then, in order to inhibit the current from the flowing in the steady state in the non-selection state, the circuitry is arranged in such a way that two current drawing MOS transistors are connected in series to each other in which the gate of one MOS transistor is connected to the output of the inverter circuit, the input of which is connected to the gate of the other MOS transistor and to the control signal. Therefore, at the moment when the operation is switched over from the selection state to the non-selection state, both the two current drawing MOS transistors are in the on state only during the delay time of the inverter to draw the current, and in the steady state in the non-selection state, the MOS transistor which received the output of the inverter is turned off. As a result, the steady-state current does not flow.

For the control of the base potential, in addition to the arrangement in which the MOS transistor is provided between the base and the high potential power source node through the resistor, there is provided another arrangement in which the high potential power source node is connected to the base through the resistor, and the MOS transistor is provided between the base and the low potential level portion. According to the latter, by making a short circuit across the base and the low potential level portion in the non-selection state, the base potential in the non-selection state can be lowered as compared with that in the selection state, thereby to carry out the multiplexing operation.

BRIEF DESCRIPTION OF THE DRAWINGS

FIG. 4 is a schematic circuit diagram showing the arrangement of an example of a circuit employing a current source control system according to the present invention;

FIG. 5 is a schematic circuit diagram showing the arrangement of a further example of a circuit employing a current source control system according to the present invention;

FIG. 6 is a schematic circuit diagram showing the arrangement of an even further example of a circuit employing a current source control system according to the present invention;

FIG. 7 is a schematic circuit diagram showing the arrangement of a circuit in which a selector of a semiconductor device is constructed using the current source control circuit of the present invention;

FIG. 12 is a schematic circuit diagram showing the arrangement of an embodiment of an emitter follower type multiplex circuit according to the present invention;

FIG. 14 is a schematic circuit diagram showing the arrangement of a further modified example of the emitter follower type multiplex circuit according to the present invention;

FIG. 16 is a schematic circuit diagram showing the arrangement of another modified example of the emitter follower type multiplex circuit according to the present invention;

FIG. 17 is a schematic circuit diagram showing the arrangement of still another modified example of the emitter follower type multiplex circuit according to the present invention;

FIG. 30 is a schematic circuit diagram showing the arrangement of an even further example of the system from a data line of a semiconductor memory to a data line of a presense amplifier in which the multiplex circuit of the present invention is used.

DESCRIPTION OF THE PREFERRED EMBODIMENTS

Figure 1:
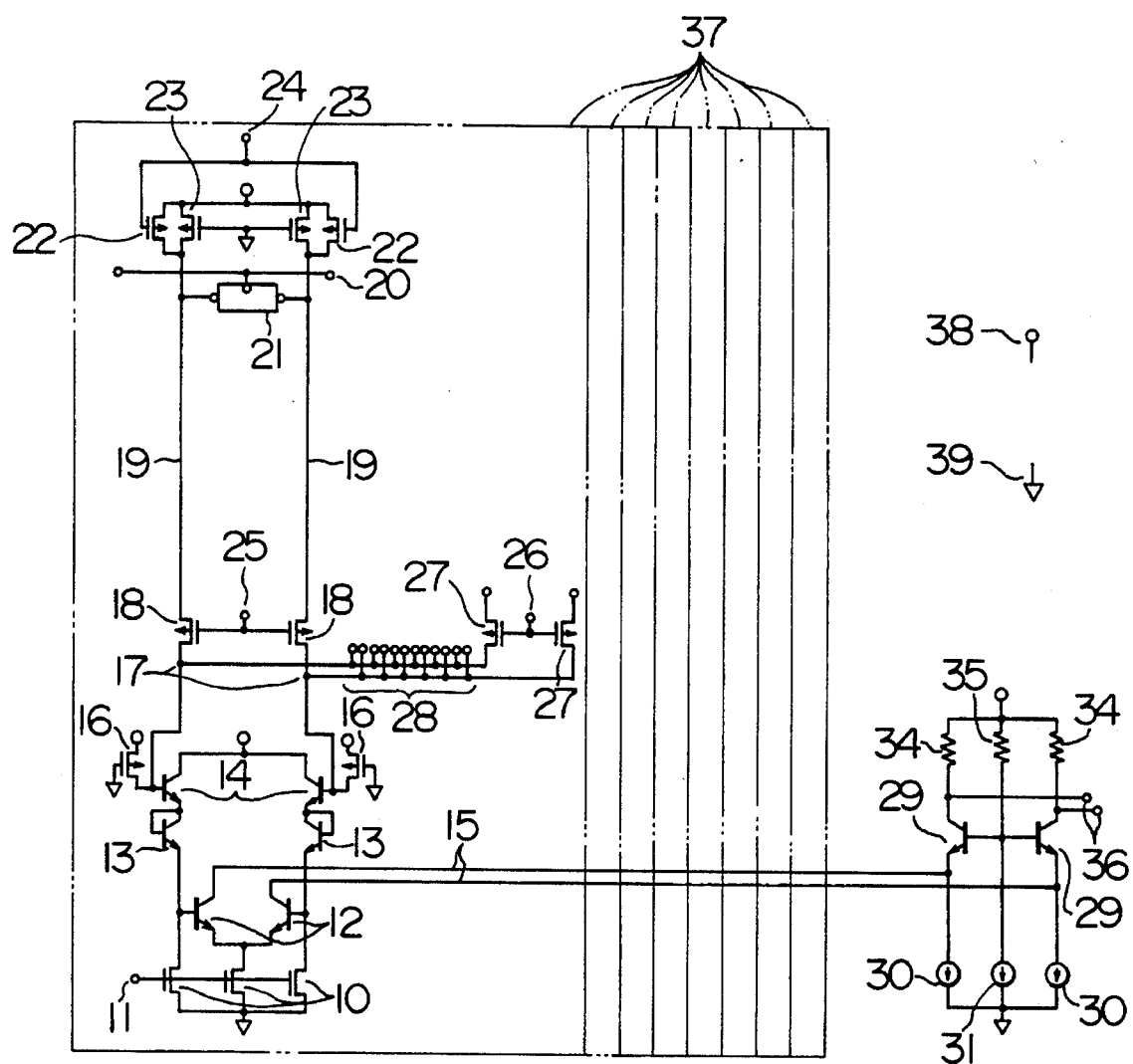
FIG. 1 is a schematic circuit diagram showing the arrangement of an example of a sense amplifier for a SRAM employing a general current source circuit.
Figure 2:
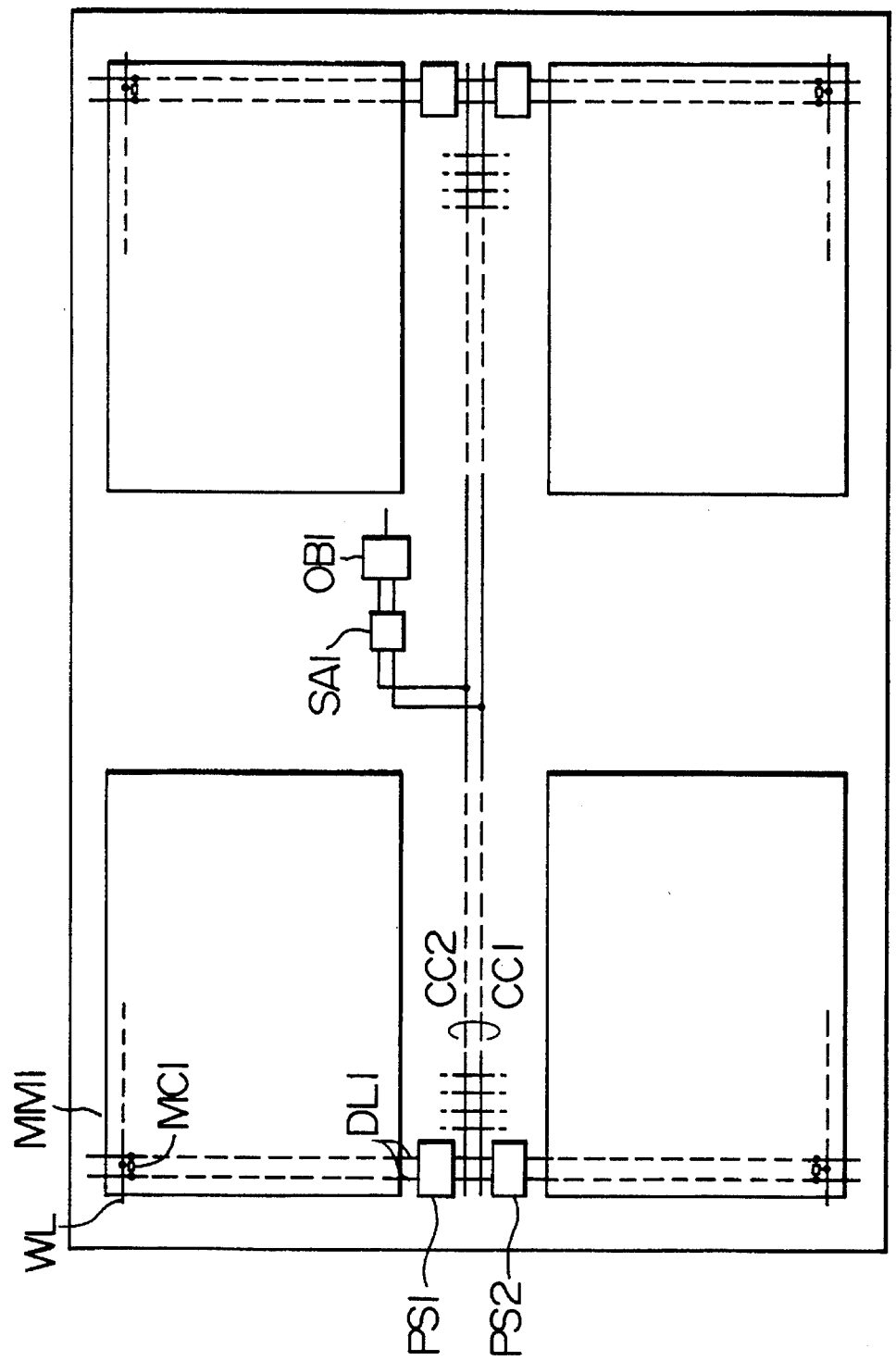
FIG. 2 is a schematic circuit diagram showing the arrangement of an example of a memory to which the present invention is applicable.
Figure 3:
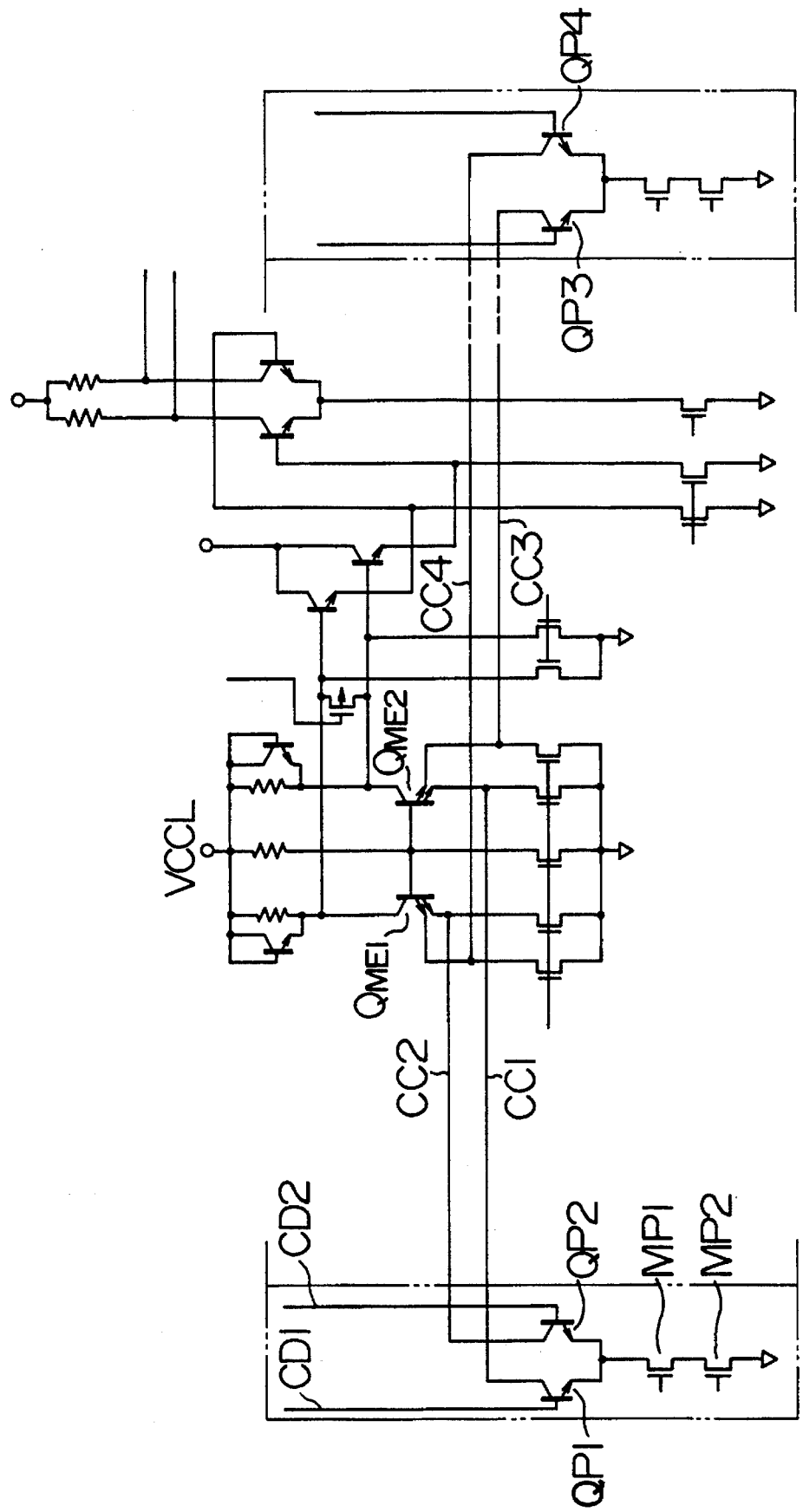
FIG. 3 is a schematic circuit diagram for use in explaining the relationship and, therefore, the disadvantages of using a multi-emitter multiplex circuit in the memory when applying the improved current source circuit thereto.

One embodiment of the present invention will hereinafter be described with reference to FIG. 4.

FIG. 4 is a schematic circuit diagram showing the arrangement of an example of a circuit employing a current source according to the present invention. In the figure, numeral 1 designates an N-channel MOS (NMOS), and numeral 3 designates a circuit to which a current is supplied. In this connection, the amount of current supplied to the circuit 3 is controlled by the NMOS 1. Numeral 5 designates a first power terminal, and numeral 4 designates a second power terminal which is a ground terminal in the present embodiment. When the NMOS 1 is turned on, the value of current supplied to circuit 3 is regulated by a constant current source 2, while when the NMOS 1 is turned off, a current flowing into the circuit 3 through the bus is approximately zero.

Since in this circuit, the change of electrical characteristics of the circuit 3 and the constant current source 2 is made to coincide with the change of the power source, the ambient temperature, the process and the like, the change of performance of the whole circuit due to the change of these conditions can be canceled or reduced sufficiently.

FIG. 5 is a schematic circuit diagram showing the arrangement of an alternative example of the present embodiment. In the present example, the circuit 3 requires a constant current source on the high potential side. This current source can be realized by means of a PMOS 7.

A further embodiment of the present invention will hereinbelow be described on referring to FIG. 6. The present embodiment may provide that the constant current source circuit 2 is made up of an NMOS 100 and a circuit for controlling the gate voltage of the NMOS. By maintaining a gate electrode 8 of the NMOS 100 at a constant potential, the NMOS 100 can be made to act as a constant current source (e.g., NMOS 100 is made to operate in the saturation region of its characteristic curve). Since the source of the NMOS 100 is grounded, a current mirror of an NMOS can be made up to be connected to the constant current source.

The advantage of this arrangement is that since the source of the NMOS 100 is grounded, the constant current source is readily constructed. One example of a constant current source by the current mirror of an NMOS is shown in FIG. 7 which will subsequently be described.

FIG. 7 is a schematic circuit diagram showing the arrangement of an even further embodiment of the present invention. The present embodiment is an example wherein the circuit of the embodiment shown in FIG. 6 is used as a semiconductor memory selector. NMOSs 121 through 128 are used to determine which of the respective circuits 101 through 108 are to be selected. The NMOSs 111 through 118 are NMOSs in which the respective sources thereof are grounded and which operate as individual constant current sources in accordance with application of a voltage through a common signal line 7 at the gates thereof, respectively. More specifically, each of the NMOS transistors 121–128 in combination with a respective one of NMOS transistors 111–118 constitutes a current source. To each of the current sources thus arranged, a bias voltage is applied to the gate electrode 7 of the corresponding one of the NMOS transistors 111–118, so that a current switch functioning by each current source may have the upper limit current value. Thus, the current value of each current source is not influenced by fluctuations of the power source voltage as compared with a sense amplifier circuit as shown in FIG. 1 to which the present invention is an improvement thereover. Namely, when each of the current sources thus arranged is turned on, it can keep a constant current value irrespective of any change in a power source voltage.

Figure 8:
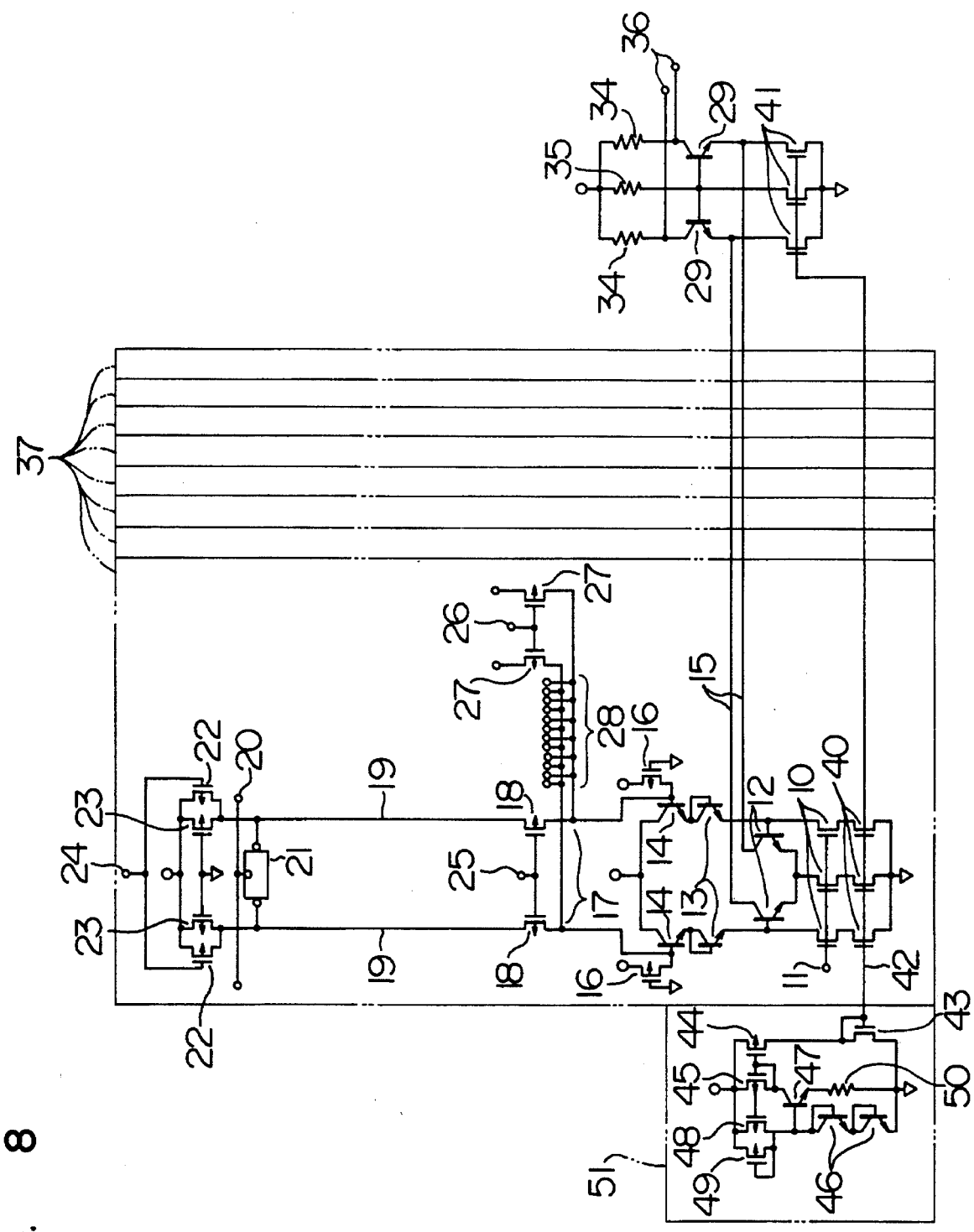
FIG. 8 is a schematic circuit diagram showing the arrangement of a sense amplifier for a SRAM employing the current source control circuit according to the present invention.

FIG. 8 is a schematic diagram showing the arrangement of another embodiment of the present invention. The present embodiment shown in FIG. 8 is an example of the circuit arrangement wherein the circuit shown in FIG. 6 is applied to a circuit for reading out data in an SRAM. The present embodiment is arranged in such a way that the current source according to the present invention is applied to the current source of the selection section of the sense amplifier which provides the prior art circuit shown in FIG. 1 with the problem as already described.

The difference of the present embodiment from the prior art circuit shown in FIG. 1 is that a circuit corresponding to the constant current source 2 shown in FIG. 4 is connected to the lower portion of the MOS transistor 10 for controlling a sense amplifier. In the case of the present embodiment, the constant current source 2 is made up of a MOS transistor 40 and a gate voltage generation circuit 51.

The description will hereinbelow be given to the operation of the present circuit. The potential of a base of a bipolar transistor 47 is maintained at 2Vbe with respect to the ground potential by a MOS transistor 48 and a bipolar transistor 46. In this connection, by Vbe, it means the potential difference between the base and the emitter of the bipolar transistor 46. To be exact, Vbe is changed in accordance with the current flowing through the bipolar transistor 46 and is expressed by the following equation.

$$Vbe = kT/q \ \ln(Ic/Is)$$

where Ic represents the current flowing through the bipolar transistor 46. Thus, the dependency of Vbe to Ic is sufficiently reduced. In this case, that dependency is ignored. Therefore, the base potential of the bipolar transistor 47 is maintained at 2Vbe with respect to the ground potential. Then, if the base current of the bipolar transistor 47 is neglected, the current flowing through the forward PN junction between the base and the emitter of the bipolar transistor 47 is identical to that flowing through the forward PN junction between the base and the emitter of the bipolar transistor 46. As a result, the voltage which is exactly Vbe is applied across a resistor 50. Thus, a current I flowing through a PMOS 45 is regulated by a resistor 50 and Vbe, and is expressed by the following equation.

$$I = Vbe/R50$$

where R50 is the resistance value of the resistor 50. The PMOSs 45 and 44 make up a current mirror circuit and cause a current regulated by the resistance value R50 and Vbe to flow through a MOS transistor 43. Since the MOS transistor 43, and MOS transistors 40 and 41 also make up a current mirror circuit through a signal line 42, these MOS transistors serve to cause a current to flow in the same manner. This current value is independent of the source voltage, and therefore, it is ensured that the performance of the present circuit is independent of the source voltage.

Moreover, an output voltage V of a bipolar transistor type differential amplifier made up of the bipolar transistors 12 and the resistors 34 is proportional to the voltage expressed by the following relationship:

$$R34 * (Vbe/R50)$$

where R34 is the resistance value of the resistor R34. Therefore, if the changes of the resistance value R34 and the resistance value R50 due to the variations in the device are made to coincide with each other, the change of V due to these changes is canceled and it is also ensured that V is constant independently of the variations.

Incidentally, the current source which has been described in the present embodiment is no more than one example. Thus, it should be understood that the present invention is not limited thereto or thereby. Especially, with respect to the arrangement of the constant current source in which the dependency to the external conditions is considered together with the internal circuit, it should be noted that any other circuit arrangement may be available.

Figure 9:
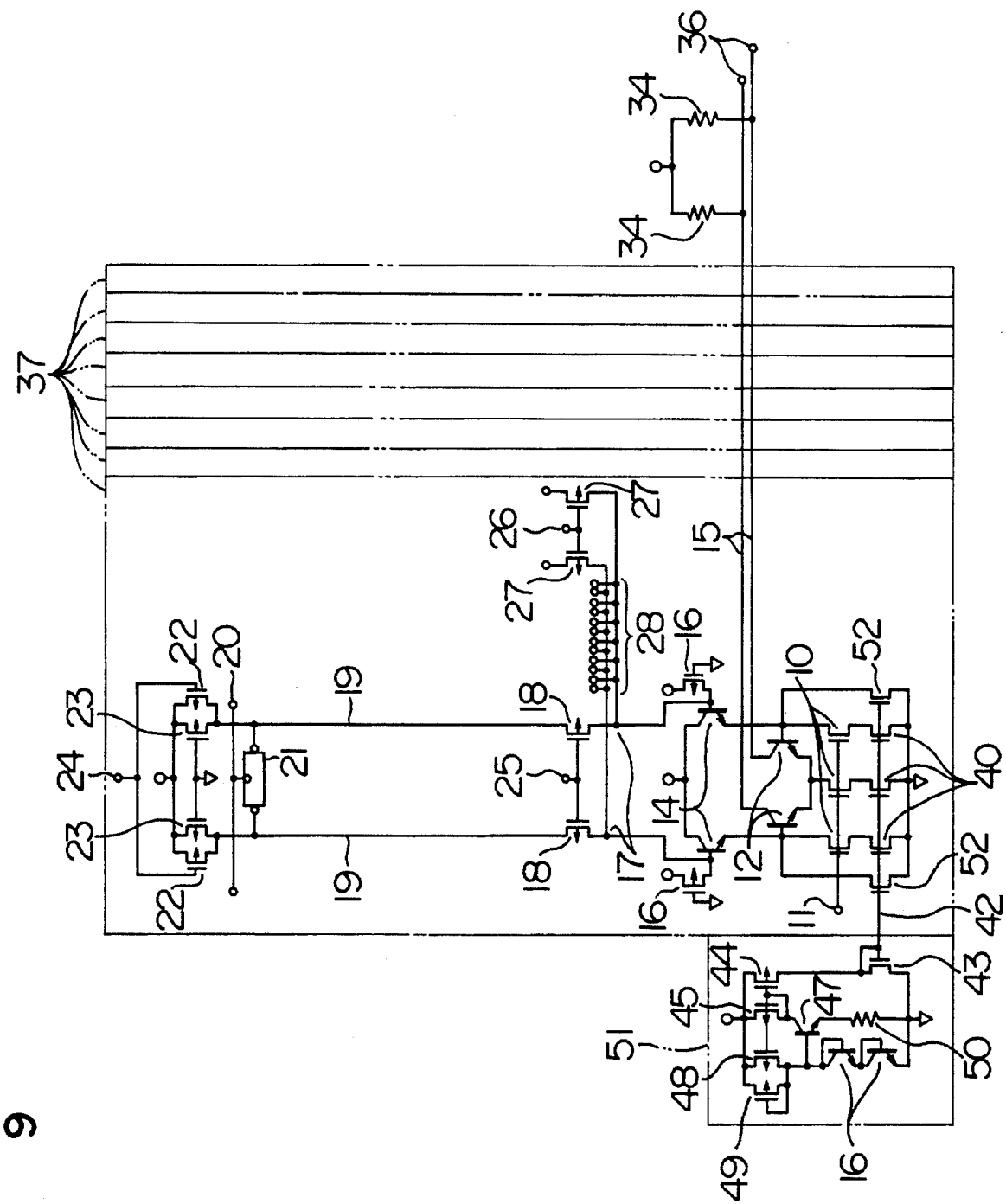
FIG. 9 is a schematic circuit diagram showing the arrangement of a sense amplifier for an SRAM employing the current source control circuit of the present invention which is operable with a lower source voltage than that of the circuit shown in FIG. 8.

FIG. 9 is a schematic circuit diagram showing the arrangement of still another embodiment of the present invention. The present embodiment will hereinbelow be described with reference to FIG. 9. The difference of the present embodiment from the embodiment of FIG. 8 is the range of the operable voltage. In the circuit shown in FIG. 8, the amplitude of the voltage across the common collector line 15 is reduced by the bipolar transistor 29. For this reason, the potential level needs to be lowered by the bipolar transistor 13. This makes the minimum value of the operable source voltage to be large. On the other hand, in the circuit shown in FIG. 9, the bipolar transistor 29 is not used. Therefore, there is no need for using the bipolar transistor 13, and the minimum value of the operable source voltage is small as compared with the embodiment of FIG. 8.

Another difference of the circuit shown in FIG. 9 from the circuit of FIG. 8 is that a constant current source made up of a MOS transistor 52 and a constant voltage generation circuit 51 is additionally provided. By the provision of the contact current source constituted by the MOS transistor 52, even when the MOS transistor 10 is turned off, the base potential of the bipolar transistor 12 can be maintained at a voltage regulated by the current flowing through the MOS transistor 52, and the bipolar transistor 14. As a result, such an advantage is obtained that when the MOS transistor 10 is turned on, the response time of the sense amplifier constituted by the bipolar transistor 12 can be shortened.

Figure 10:
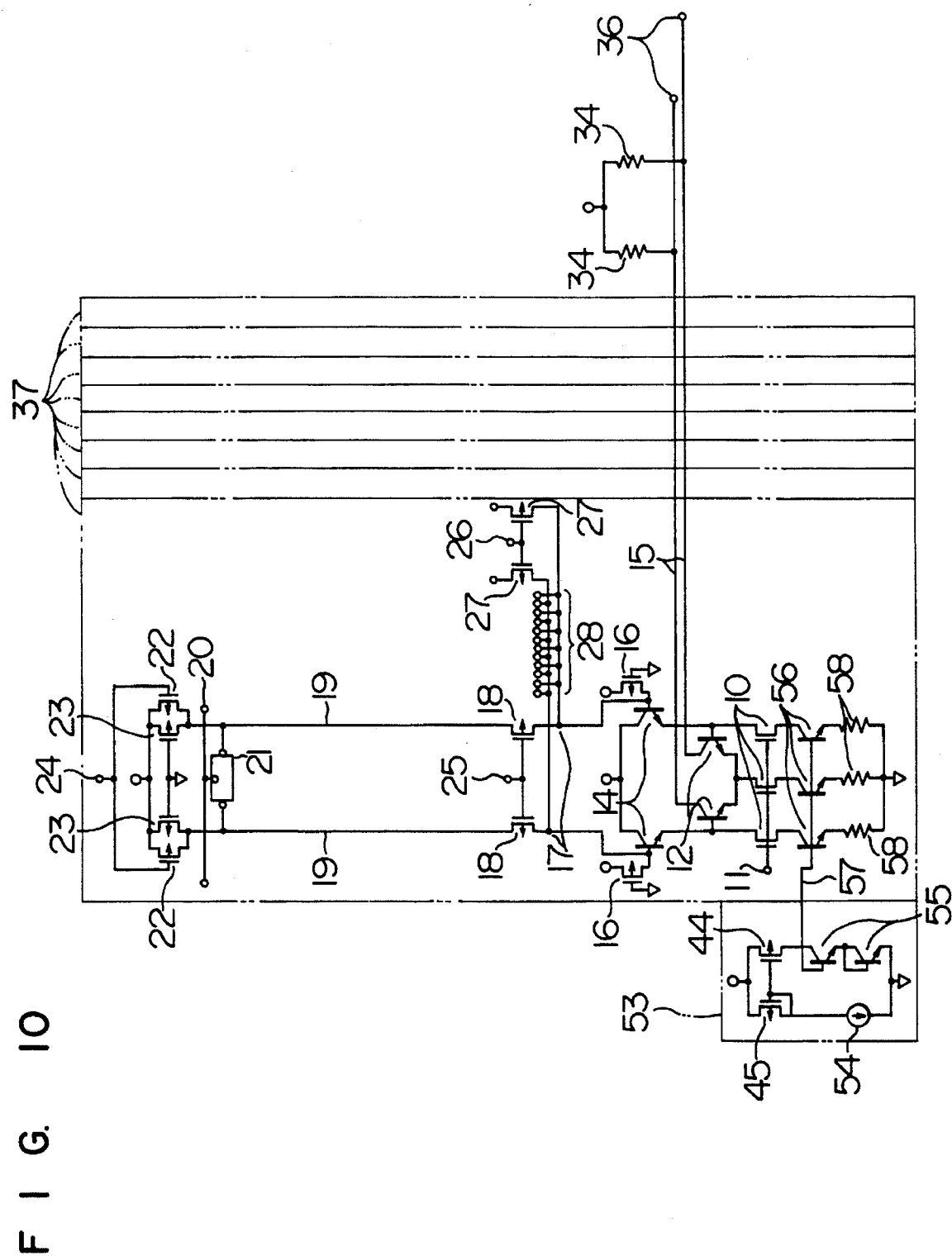
FIG. 10 is a schematic circuit diagram showing the arrangement of a sense amplifier for an SRAM which is constructed by the current source control circuit of the present invention in which a bipolar transistor and a resistor are used in a constant current source section.

FIG. 10 is a schematic circuit diagram showing the arrangement of yet another embodiment of the present invention. In the circuit shown in FIG. 10, the constant current source 2 shown in FIG. 4 is made up of bipolar transistors 56, resistors 58 and a constant voltage generation circuit 53.

In the constant voltage generation circuit 53, numeral 54 designates a constant current generation circuit, and numeral 55 designates each of two bipolar transistors for generating a voltage of 2Vbe on the basis of the current from the circuit 54. When the voltage of 2Vbe is applied to a signal line 57 by the constant current generation circuit 53, a voltage of Vbe is applied across each of the resistors 58, and as a result, the bipolar transistors 56 and the resistors 58 make up a constant current source. This constant current source is controlled by the MOS transistor 10.

The effect inherent in the present embodiment is that since the constant current source is constituted by the bipolar transistors, it is difficult for the constant current source to be influenced by the change of electrical characteristics of the MOS transistor due to the variations in the process. In order to perfectly remove the influence by the change of electrical characteristics of the MOS transistor, there may be used a constant voltage source in which the PMOS transistors 44 and 45 are not used.

Figure 11:
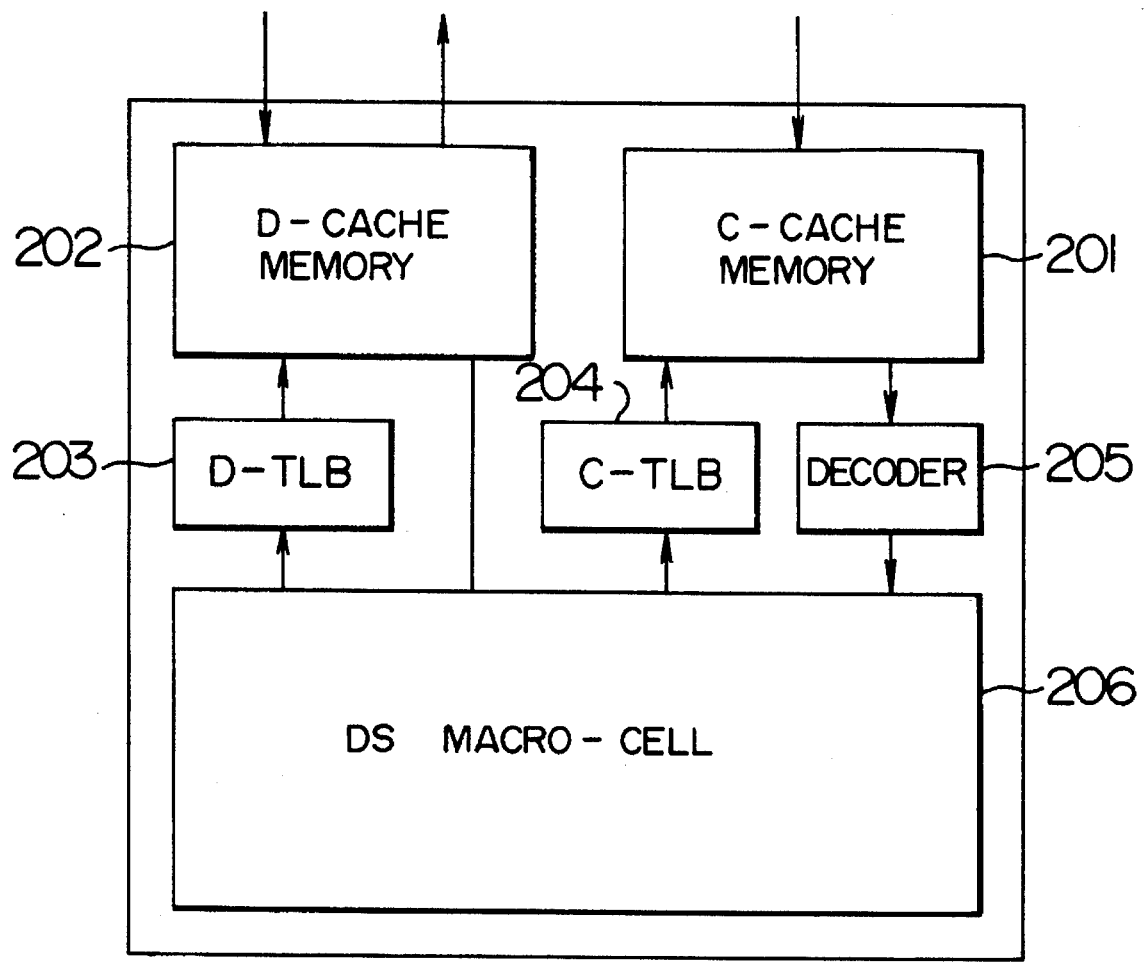
FIG. 11 is a block diagram showing the arrangement of an embodiment in which the present invention is applied to an internal memory of a microprocessor.

FIG. 11 is a block diagram showing the arrangement of a further embodiment of the present invention. This figure shows the internal arrangement of a general microprocessor.

The microprocessor is, as well known, made up of a C-cache memory 201 for receiving an instruction, an instruction decoder section 205, a data structure (DS) macrocell 206 for executing a calculation processing on the basis of an output signal from the decoder section, a D-cache memory 202 for storing therein the calculation result, a code translation look-aside buffer (C-TLB) 204 for assigning an address used for reading out the subsequent instruction after the calculation from the C-cache memory 201, and a D-TLB 203 for converting a logical address of the calculation result into a physical address of the D-cache memory 202 to assign a data storage address.

To realize a high speed operation of the microprocessor, it is essential to achieve high performance of the data cache memory and the instruction cache memory. By employing the memory arrangement in which the current control system according to the present invention is used in these cache memories, the stable performance can be obtained.

The effect inherent in the present embodiment is that a microprocessor of high performance is achievable in which the performance thereof is independent of changes in the source voltage and the ambient temperature as well as being independent of the process variations thereof during manufacture.

According to the above embodiment of the present invention, there is provided the effect in that it is possible to eliminate the source voltage dependency, the ambient temperature dependency and the process variation dependency of the device characteristics, of the constant current source which requires the on/off control and the like.

Moreover, there is provided another effect in that by applying the present circuit to the bipolar transistor type differential amplifier used in the sense amplifier of the memory, it is possible to suppress the source voltage dependency, the process variation dependency and the ambient temperature dependency of performance of the sense amplifier.

Subsequently, the description will be given to an embodiment of a multiplex circuit according to the present invention and a semiconductor integrated circuit apparatus employing the same with reference to the accompanying drawings.

FIG. 12 is a schematic circuit diagram showing the arrangement of a multiplex circuit of the present invention. The multiplex circuit is the most basic circuit of an emitter follower type multiplex circuit. First, the circuit arrangement will be described. In the figure, the reference symbols BC1, BC2, . . . designate a plurality of basic circuits making up the multiplex circuit. The individual basic circuits include: first power terminals T11, T12, . . . connected to the side of a high potential power source VCC; second power terminals T21, T22, . . . connected to a low potential power source VEE; input terminals IN1, IN2, . . . ; select terminals SE1, SE2, . . . ; bipolar transistors Q11, Q12, . . . having emitters connected to the respective second power terminals T21, T22, . . . , collectors connected to the respective first power terminals T11, T12, . . . , and bases connected to the respective input terminals IN1, IN2, . . . ; MOS transistors M11, M12, . . . and resistors R11, R12, . . . connected in series between the first power terminals T11, T12, . . . , and the input terminals IN1, IN2, . . . ; and MOS transistors M21, M22, . . . as current drawing means B1, B2, . . . connected between connections (control nodes) NC1, NC2, . . . between the MOS transistors M11, M12, . . . and the resistors R11, R12, . . . , and the low potential power source VEE. The individual gates of the MOS transistors M11, M12, . . . and the individual gates of the MOS transistors M21, M22, . . . are connected to the select terminals SE1, SE2, . . . , respectively. The second power terminals T21, T22, . . . are connected to the low potential power source VEE through MOS transistors as a current source circuit SI and an output terminal OUT is extracted from a connection to the current source circuit SI.

The operation of the multiplex circuit will subsequently be described. To one input terminal IN1 out of the input terminals IN1, IN2, . . . are applied data to be selected. At this time, a select signal is inputted to the select terminal SE1 to turn the MOS transistor M11 on.

By turning the MOS transistor M11 on as described above, the potential at the control node NC1 is raised to the potential of the high potential power source VCC, and to the base of the bipolar transistor Q11 is applied the voltage which is obtained by subtracting the sum of the voltage drop due to the on resistance of the MOS transistor M11 and the voltage drop across the resistor R11 from the high potential power source VCC. On the other hand, to the remaining input terminals IN2, . . . out of the input terminals IN1, IN2, . . . are inputted data which are not selected and at the same time, to the remaining selector terminals SE2, . . . is applied a non-selection signal, thereby to hold the MOS transistors M12, . . . in the off state. As a result, the control nodes NC2, . . . are electrically isolated from the high potential power source VCC. Moreover, when the non-selection signal is applied to the gates of the MOS transistors M22, . . . , the MOS transistors M22, . . . are turned on, and the base potential of the bipolar transistor Q12 becomes lower than that of the bipolar transistor Q11. Since the output potential at the output terminal OUT is determined by the base which is at a higher potential than that at OUT, a potential which is lower than the base potential of the bipolar transistor Q11 by the base-emitter voltage Vbe becomes the output potential. Thus, the circuit of FIG. 12 serves as a multiplex circuit since the base potential of the bipolar transistors to which the data to be non-selected is inputted is lowered as compared with the base potential of the bipolar transistor to which the data to be selective is inputted.

According to the multiplex circuit having such an arrangement, since the bipolar transistor (Q11) and the current source circuit SI are only connected in series and provided between the high potential power source VCC and the low potential power source VEE, there is provided the advantage in that the multiplex circuit is operated with a low voltage exceeding the sum of voltage of Vbe (0.8 V) of the bipolar transistor and the voltage drop (1.0 V) across the current source SI (MOS transistor).

Figure 13:
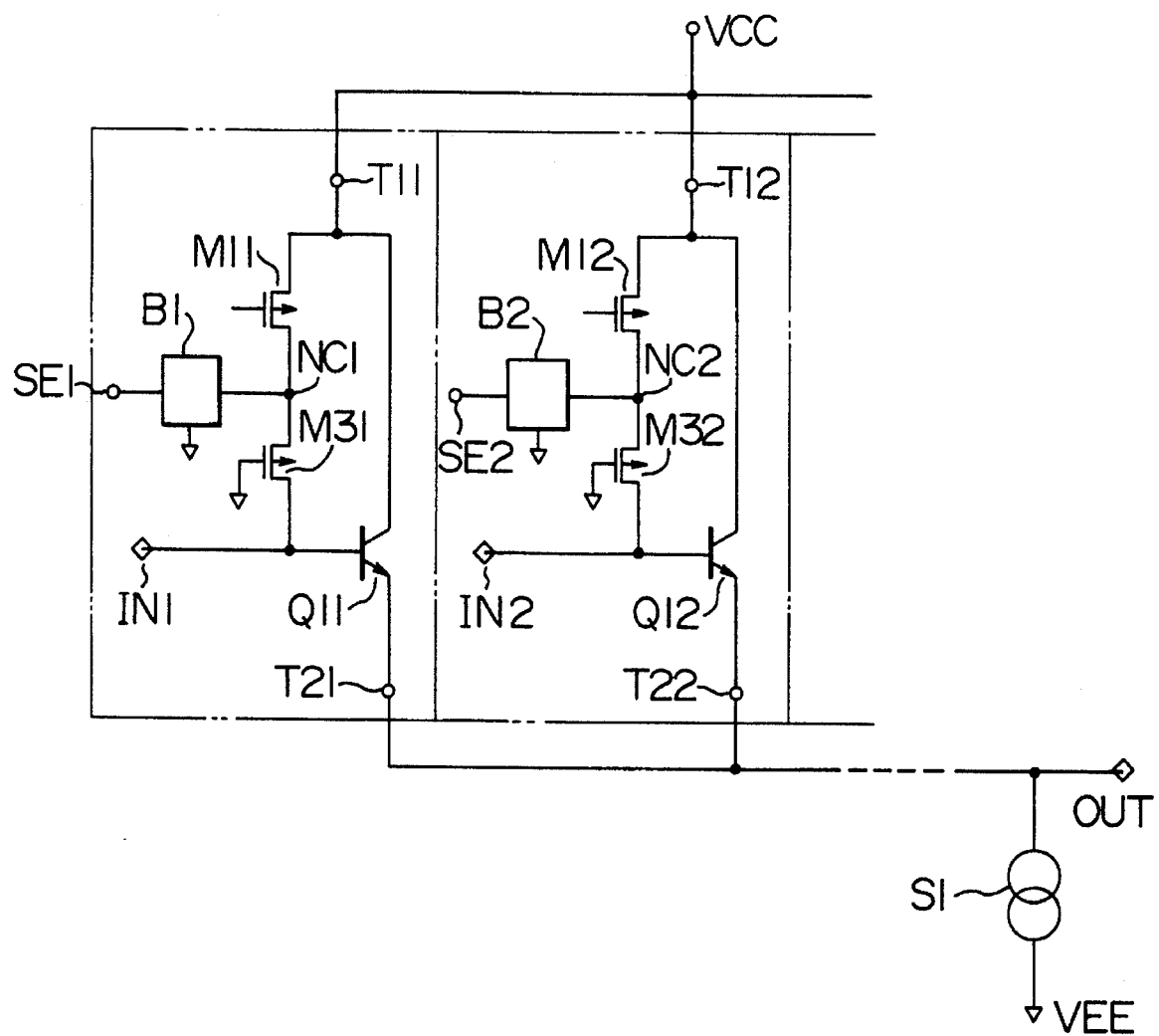
FIG. 13 is a schematic circuit diagram showing the arrangement of a modified example of the emitter follower type multiplex circuit according to the present invention.

FIG. 13 is a schematic circuit diagram showing the arrangement of a modified example of the emitter follower type multiplex circuit shown in FIG. 12. In the present modified example, instead of the resistors R11, R12, . . . , MOS transistors M31, M32, . . . are employed. Each of the MOS transistors has the same conductivity type as that of each of the MOS transistors M11, M12, . . . . According to this arrangement, there is provided the advantage in that the multiplex circuit can be miniaturized when that circuit is formed in the semiconductor integrated circuit.

FIG. 14 is a schematic circuit diagram showing the arrangement of a further modified example of the emitter follower type multiplex circuit shown in FIG. 12. The present modified example is arranged in such a way that diodes D11, D12, . . . are connected in parallel to the MOS transistors M11, M12, . . . , respectively. According to this arrangement, since the potentials of the control nodes NC1, NC2, . . . are maintained during the ON-state of MOS transistors M11, M12, . . . , at a level higher than that obtained by subtracting each of the forward voltage of the diodes D11, D12, . . . from the potential of the high potential power source VCC, there is provided the advantage in that it is possible to reduce the change of the base potentials of the bipolar transistors Q11, Q12, . . . .

Figure 15:
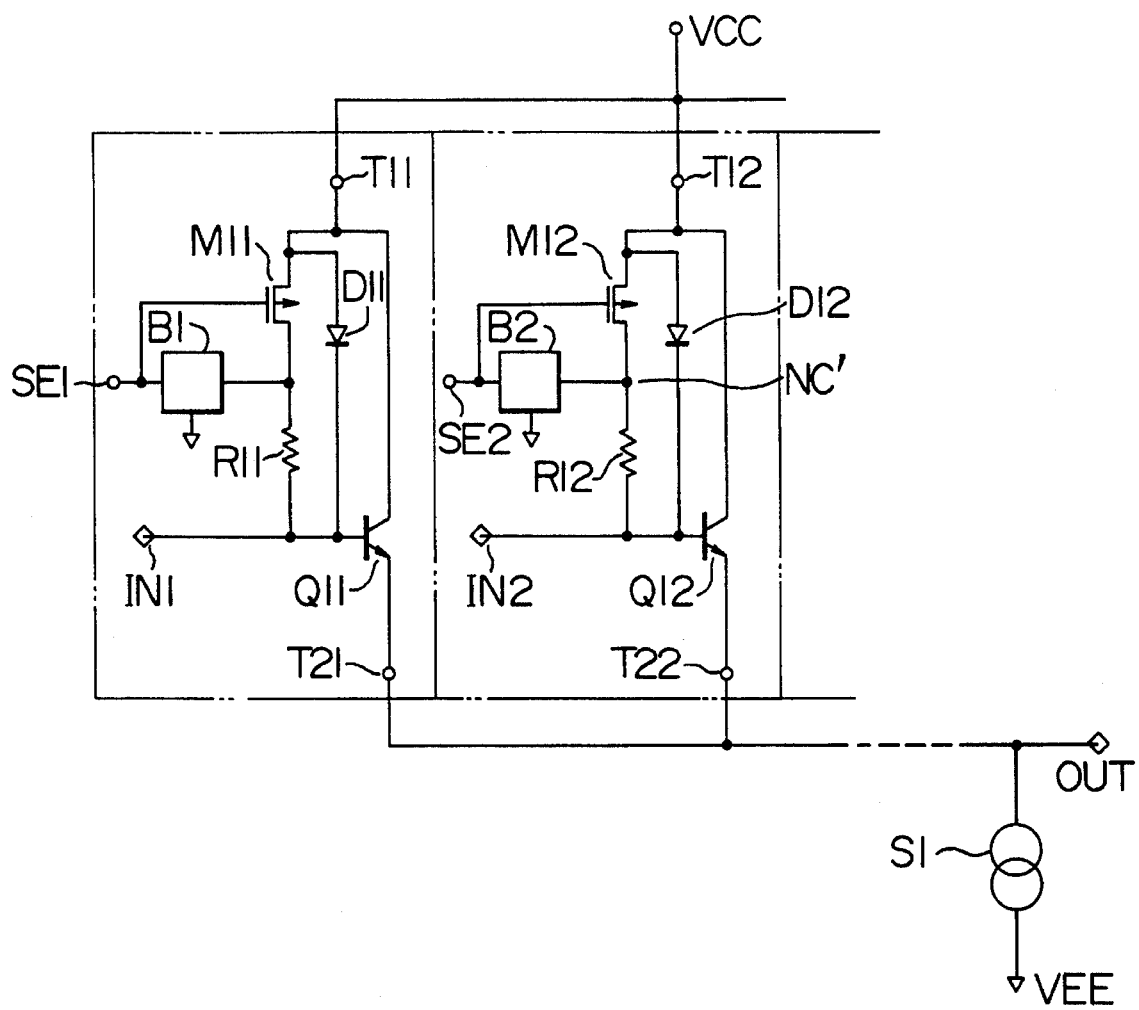
FIG. 15 is a schematic circuit diagram showing the arrangement of an even further modified example of the emitter follower type multiplex circuit according to the present invention.

FIG. 15 is a schematic circuit diagram showing the arrangement of an even further modified example of the multiplex circuit shown in FIG. 12. The present modified example is arranged in such a way that diodes D11, D12, . . . are connected between the high potential power source VCC and the base terminals of the bipolar transistors Q11, Q12, . . . . According to this arrangement, the potentials of the control nodes NC1, NC2, . . . are not lowered to a level less than a potential which is obtained by subtracting each of the forward voltages of the diodes D11, D12, . . . from the potential of the high potential power source VCC.

FIG. 16 is a schematic circuit diagram showing the arrangement of another modified example of the emitter follower type multiplex circuit of FIG. 12. The present modified example is arranged in such a way that resistors R21, R22, . . . are connected between the MOS transistors M11, M12, . . . and the control nodes NC1, NC2, . . . . According to such an arrangement, in addition to the advantage inherent in the circuit shown in FIG. 14, there is provided another advantage in that the change of the potential of the control nodes NC1, NC2, . . . can be maintained at a level (0.2 to 0.3 V) less than each of the base-emitter voltages of the bipolar transistors Q11, Q12, . . . .

FIG. 17 is a schematic circuit diagram showing the arrangement of still another modified example of the emitter follower type multiplex circuit of FIG. 12. In the present modified example, instead of the diodes D11, D12, . . . shown in FIG. 16, there are used resistors R31, R32, . . . .

In the present example, there is provided the advantage in that even if the current drawing circuit means is not provided, the potentials of the control nodes NC1, NC2, ... can be lowered by only turning the MOS transistors M11, M12, ... off. Further, if the current drawing means is provided, such an operation can be performed surely.

FIGS. 18A through 18F are respectively circuit diagrams showing the arrangements of different embodiments of the current drawing means.

Figure 18A:
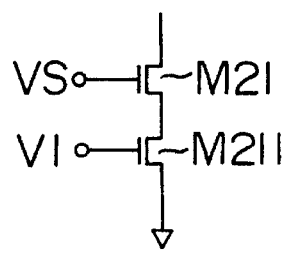
FIGS. 18A through 18F are respectively schematic circuit diagrams showing the arrangements of different embodiments of current drawing means.

The embodiment shown in FIG. 18A is arranged in such a way that a MOS transistor M211 as a constant current source is connected in series to a MOS transistor M21. According to the present current drawing means, in the case where the MOS transistor is provided with a bypass circuit, a low power consumption can be attained by reducing a through current.

Figure 18B:
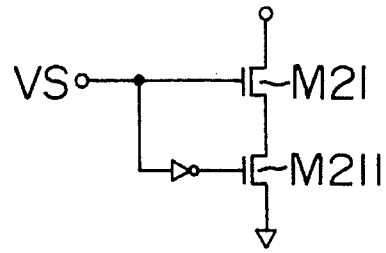
Figure 18C:
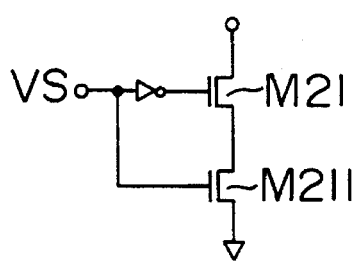

FIG. 18B and FIG. 18C show respective modified examples of the embodiment shown in FIG. 18A. Each of the present modified examples is arranged in such a way that an inverter is connected to a gate of one of the MOS transistors M21 and M211 to apply the same gate signal to both the MOS transistors. According to these arrangements, when the MOS transistor M21 is turned on, the MOS transistor M211 is switched over from the on state to the off state. However, since the time delay is present, there occurs the period of time when both the MOS transistors are in the on state. Thus, it is possible to draw a current for a short time. Even if the through current is caused to flow, since the time required for the current flow is short, it is possible to attain a low power consumption. It is important that the inverter is designed so as to sufficiently perform the current drawing operation.

Figure 18D:
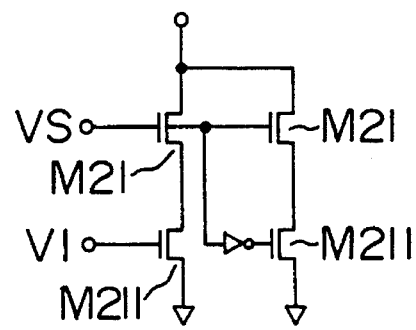

The embodiment shown in FIG. 18D is arranged by combining the means of FIG. 18A and FIG. 18B with each other. According to the present current drawing means, the current drawing operation can be performed surely as compared with the means of FIG. 18A and FIG. 18B.

Figure 18E:
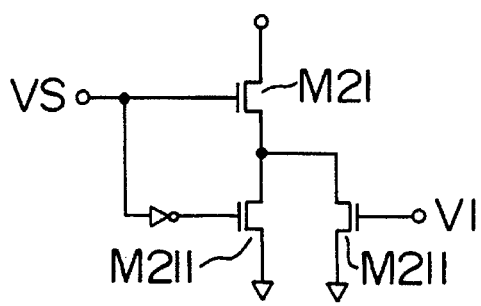

The embodiment shown in FIG. 18E is arranged in such a way that the MOS transistors M21 and M211 of FIG. 18D are simplified.

Figure 18F:
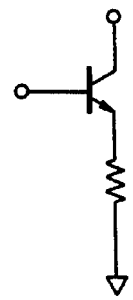

The current drawing means shown in FIG. 18F is an example wherein instead of the MOS transistor M21, a bipolar transistor is used.

FIGS. 19A through 19D are, respectively, circuit diagrams showing the arrangements of different embodiments of the current source circuit SI.

Figure 19A:
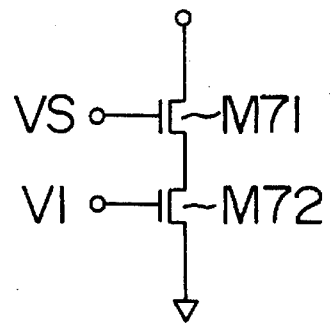
FIGS. 19A through 19D are, respectively, schematic circuit diagrams showing the arrangements of other embodiments of a current source circuit.

The embodiment shown in FIG. 19A is arranged in such a way that a MOS transistor M71 for switching and a MOS transistor M72 as a constant current source are connected in series with each other. In the present embodiment, since only when the MOS transistor M71 is in the selection state, the MOS transistor M71 is normally in the on state, there is provided the advantage in that the operation is performed at a high speed and the power consumption is small.

Figure 19B:
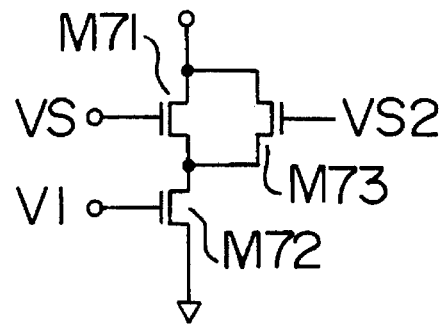

The embodiment shown in FIG. 19B is arranged in such a way that a MOS transistor M73 is connected in parallel to the MOS transistor M71 of FIG. 19A. In the present embodiment, even in the non-selection state, a small current is caused to flow, whereby the multiplexing operation can be performed surely.

Figure 19C:
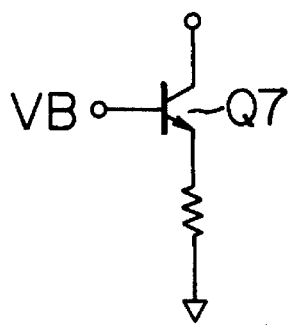

The embodiment of FIG. 19C is an example wherein a bipolar transistor Q7 is used as a switching device.

Figure 19D:
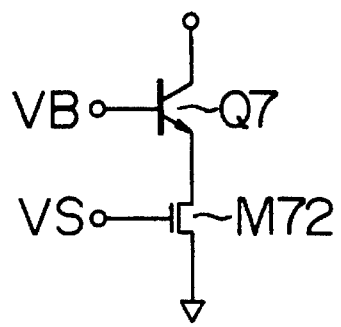

The embodiment shown in FIG. 19D is arranged in such a way that the bipolar transistor Q7 and the MOS transistor M72 are connected in series to each other.

Figure 20:
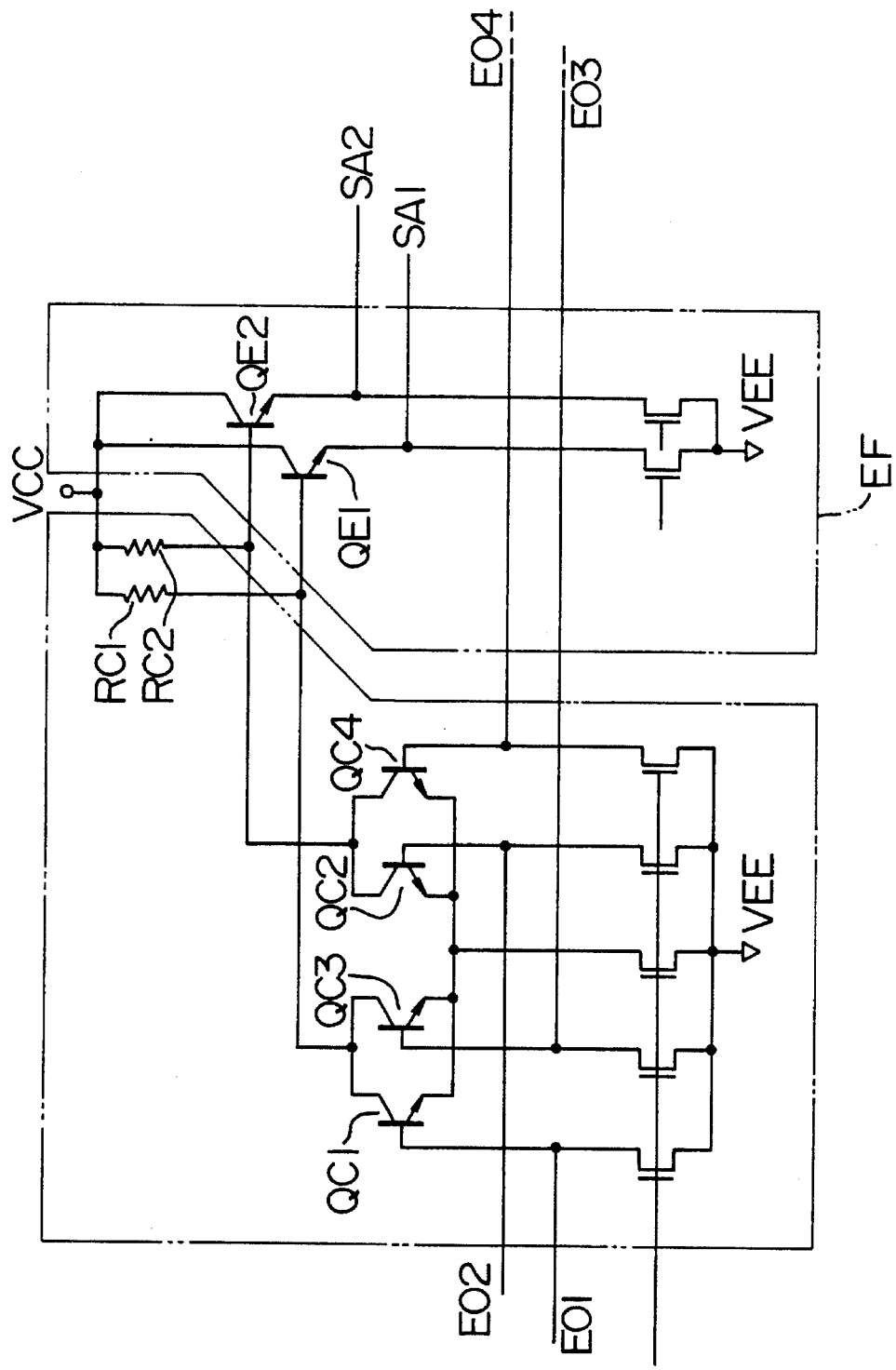
FIG. 20 is a schematic circuit diagram showing the arrangement of an embodiment of a collector dot type multiplex circuit of the present invention.

FIG. 20 is a schematic circuit diagram showing the arrangement of yet another embodiment of the present invention. The present embodiment is a collector dot type multiplex circuit which is used for receiving the output from the multiplex circuit to further multiplex data. The reference symbols E01 through E04 designate input terminals for receiving the outputs from the multiplex circuit in the preceding stage. In the case where the common collector line extending along the long side of the memory chip is divided into four blocks for example, the outputs which are obtained by multiplexing the data from two blocks every horizontal or vertical direction of the chip are designated E01, E02 and E03, E04. By the collector dot arrangement in which a collector of a bipolar transistor QC1 for receiving E01 as the input thereof and a collector of a bipolar transistors QC3 for receiving E03 as the input thereof are connected to each other, only the bipolar transistor of which base potential is on the "High" level as the selection level is operated, and a value which is obtained by subtracting the product of a collector current of a bipolar transistor QC1 or QC3 of which base potential is higher than that of the other and a resistance value of a load resistor RC1 from the potential of the high potential power source VCC becomes an output of the collector. Thus, it is possible to multiplex the input data. In the present embodiment shown in FIG. 20, since the arrangement of the differential amplifier is employed, the collector potential as an output is outputted to sense amplifiers SA1 and SA2 or an output buffer for example in the subsequent stage, through an emitter follower circuit EF made up of bipolar transistors QE1 and QE2.

The resistors (RC1 and RC2), the bipolar transistors (QC1, QC2, ...) and the MOS transistors are connected in series and provided between the high potential power source VCC and the low potential power source VEE. Therefore, the circuit of the present embodiment can perform the multiplexing operation with a voltage more than the sum of the voltage drop (0.05 V) across each resistor, Vbe (0.8 V) of each bipolar transistor and the voltage drop (1.0 V) across each MOS transistor, i.e., with a low voltage.

Moreover, in the present embodiment, since the common collector line can be divided into four blocks, the signal delay with the common collector line is reduced and the high speed operation is realized. As a result of making a 16 Mbit-BiCMOS SRAM on an experimental basis, as compared with the signal delay of 3.0 ns in the prior art case of no division of the common collector line, the high speed operation can be largely improved because the delay time of 2.1 ns can be obtained in the case of the division of the common collector line.

Further, in the collector dot type multiplex circuit of the present embodiment, the input voltage is "Low" and the output voltage is "High" so that the logic level is reversed to the emitter follower type multiplex circuit. Therefore, by combining the collector dot type multiplex circuit with the emitter follower type multiplex circuit, it is possible to realize the multiechelon multiplex. The details of the combination will be described in subsequent embodiments.

Figure 21:
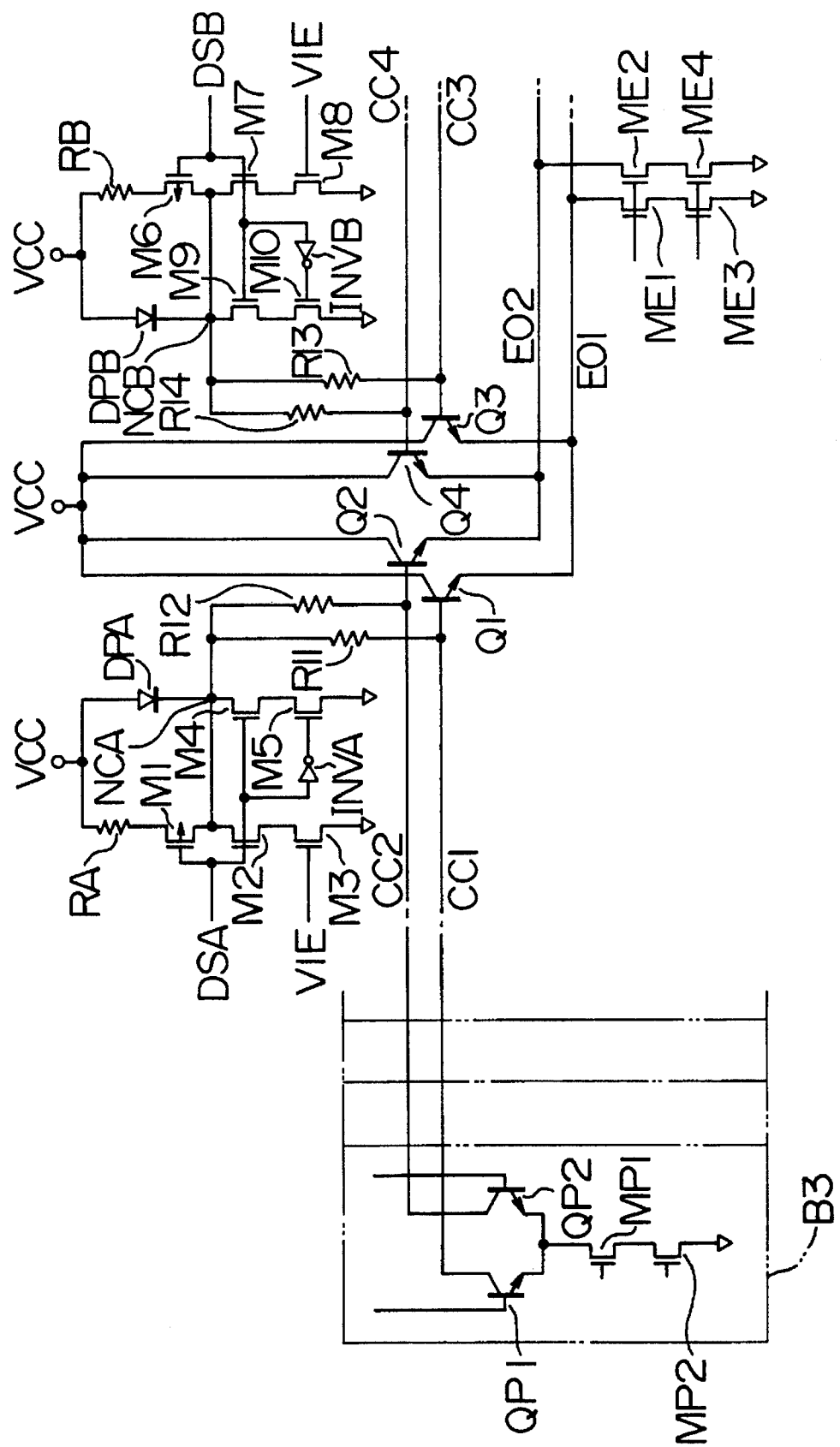
FIG. 21 is a schematic circuit diagram showing the arrangement of an embodiment in which the emitter follower type multiplex circuit of the present invention and a presense amplifier circuit are combined with each other.

FIG. 21 is a schematic circuit diagram showing the arrangement of a further embodiment of the present invention. The present embodiment is an example wherein the emitter follower type multiplex circuit is combined with the presense amplifier circuit in a preceding stage. In the figure, the reference symbols CC1 and CC2 designate the so-called common collector lines for connecting the outputs of the presense amplifiers made up of a differential voltage to differential current conversion circuit in the before stage and collectors of bipolar transistors Q1 and Q2 in the multiplex circuit, in other words, input terminals of the multiplex circuit. The reference symbols R11 and R12 designate load resistors for the current to voltage conversion, similarly in the embodiment of FIG. 12. When the block including CC1 and CC2 is selected, a "Low level" signal is inputted to a select terminal DSA to turn a MOS transistor M1 on. As a result, a potential at a control node NCA is raised up to a level which is obtained by subtracting the voltage drop due to the one resistance of the MOS transistor M1 and the load resistor RA from the potential of the high potential power source VCC. At this time, MOS transistors M2 and M4, and a diode DPA are in the off state. On the other hand, when the block including CC3 and CC4 is in the non-selection state, a "High level" signal is inputted to DSB to turn a MOS transistor M6 on. At this time, since a MOS transistor M7 is in the on state and a MOS transistor M8 having a terminal VIE to which a constant voltage is applied is in the on state, the current is caused to flow through the MOS transistors M7 and M8. Then, the potential of NCB is intended to be lowered. However, when the potential of NCB is lowered to a level equal to a value which is obtained by subtracting the base-emitter voltage Vbe of the bipolar transistor from the potential of the high potential power source VCC, a diode D2 becomes in the on state and a current flows through the diode D2. As a result, the potential of NCB is not lowered to a level of (VCC-Vbe) or less. Now, taking the power consumption into consideration since a current flows steadily through the MOS transistors M7 and M8 in the selection state, there is needed some consideration for suppressing the current flowing through the MOS transistors M7 and M8, such as reduction of the conductance of the MOS transistor M8. Further, although a MOS transistor M9 is in the on state, a MOS transistor M10 is turned off by an inverter INVB connected to the gate of M10 so that a current does not flow therethrough steadily. However, at the moment when the operation is switched over from the selection state to the non-selection state, i.e., at the moment when DSB is changed from the "Low level" to the "High level", both the MOS transistors M9 and M10 are turned on during the delay time of the inverter INVB so that the potential of NCB is intended to be lowered. Then, if the conductances of the MOS transistors M9 and M10 are sufficiently increased, the potential of NCB is rapidly lowered to a level of (VCC-Vbe) within the delay time of the inverter INVB. When the operation is in the above state, the bipolar transistors Q1 and Q2 are operated by the signals on CC1 and CC2 which are selected so that to E01 and E02 connected to the respective emitters of the bipolar transistors Q1 and Q2 are outputted signals corresponding to a voltage having a level which is lower than that across CC1 and CC2 by Vbe. Bipolar transistors Q3 and Q4 are not operated since each of the emitter-base voltages thereof is less than Vbe, and therefore, they have the multiplexing function. Moreover, load resistors RA and RB are connected in series to the MOS transistors M1 and M6, respectively, to set the potential in the selection state to a level near the potential in the non-selection state, whereby the amplitudes of NCA and NCB in both the selection and non-selection states are reduced to realize the high speed operation and the power saving. According to the above operations, since the common collector line having the large wiring capacitance can be divided, the signal delay due to the wiring resistance and the wiring capacitance can be reduced. As a result of making a 16M bit-BiCMOS SRAM on an experimental basis, as compared with the signal delay of 3.0 ns in the case of no division of the common collector line, the delay time can be reduced to 2.3 ns in the case where the common collector line is divided into two blocks, thus realizing the high speed operation.

Figure 22:
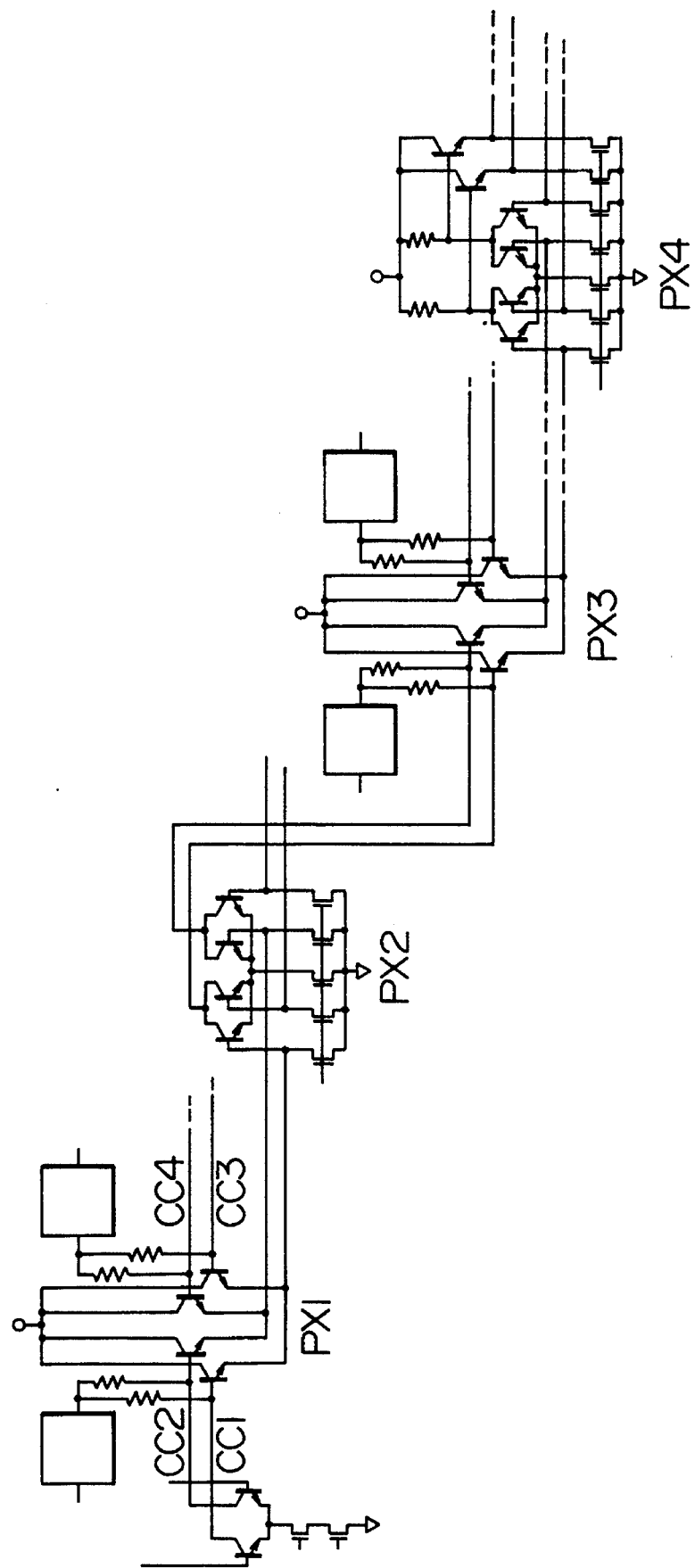
FIG. 22 is a schematic circuit diagram showing the arrangement of an embodiment in which the emitter follower type multiplex circuit and the collector dot type multiplex circuit of the present invention are combined with each other.

FIG. 22 is a schematic circuit diagram showing the arrangement of an embodiment wherein the output signal of the circuit of FIG. 20 is further multiplexed. In the figure, a circuit designated by the reference symbol PX2 is arranged in such a way that the emitter follower pair and the load resistor pair are removed from the collector dot type multiplex circuit as described on referring to FIG. 20, so that the present circuit can be connected to the emitter follower type multiplex circuit in the subsequent stage. By combining the emitter follower type multiplex circuit and the collector dot type multiplex circuit with each other, the data bus line can be divided into the multi-stage. For example, an emitter follower type multiplex circuit PX1 in the first stage serves to multiplex signals on the two pairs of common collector lines which are obtained by the division. The collector dot type multiplex circuit PX2 in the second stage serves to multiplex the two pairs of output signals from the preceding stage to perform the differential voltage to differential current conversion thereby to output the resultant signals to an emitter follower type multiplex circuit PX3 in the third stage. PX3 serves to multiplex the input signals from the two signal paths in a similar manner to PX1 to output the resultant signals to a collector dot type multiplex circuit PX4 in the third stage. Moreover, PX4 multiplexs the two pairs of output signals from the preceding stage and is connected to an output buffer through an emitter follower circuit. In the present embodiment, since the two pairs of data are multiplexed in each of the four stages, the common collector line can be divided into sixteen blocks. If the pairs of data which are multiplexed in each of stages are further increased to four or eight, the number of divisions of the common collector line can be further increased. Moreover, similarly, even if the number indicative of division of stages is decreased to two or three, the number indicative of the division of a common collector line can also be increased. By employing this division method, the hierarchy of the data bus line can be freely increased. Therefore, the hierarchy of the data bus is optimized by taking the delay time and the layout of the signal into consideration, whereby the data bus line can be divided and the signal delay in the data bus line can be reduced. Thus, it is possible to shorten the access time.

Figure 23:
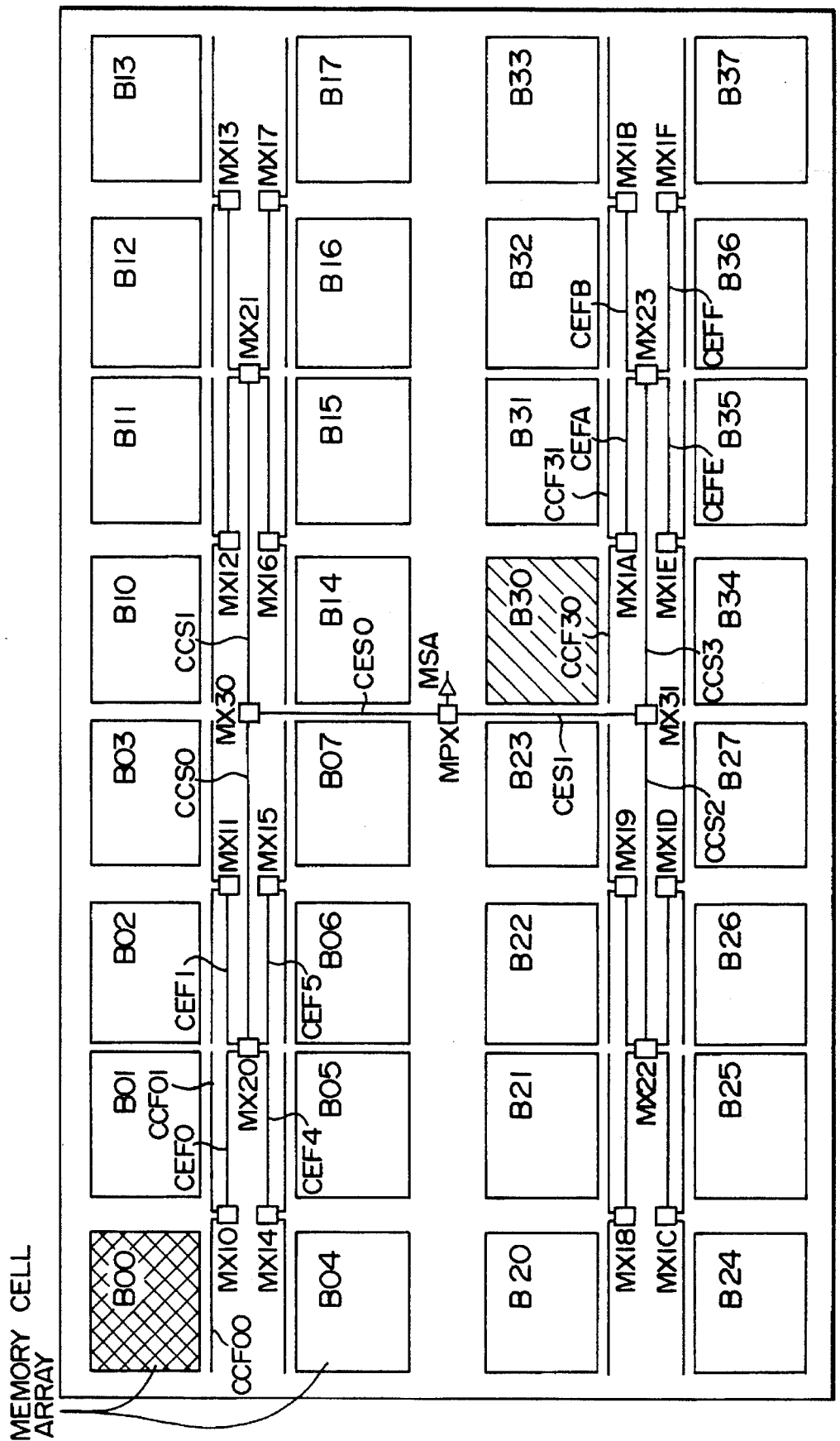
FIG. 23 is a schematic block diagram showing the arrangement of an example of a large storage capacity memory which is constructed using the multiplex circuit of hierarchical structure shown in FIG. 22.

FIG. 23 is a schematic block diagram showing the layout of a memory array in a large capacity-memory to which the arrangement of FIG. 22 is applied.

In FIG. 23, there is shown the hierarchy of the data bus by taking a 16M bit-SRAM as an example. One block of the memory cell array is made up of 512 rows×1024 columns.

Data read out from a block (memory cell array) B00 are outputted to a common data bus (common collector line) CCF00 through a presense amplifier (bipolar transistor type differential amplifier).

The data on the common collector lines CCF00 and CCF01 are multiplexed by a multiplex (emitter dot type) circuit MX10 (corresponding to PX1 of FIG. 22) and are then outputted to a common data bus (common emitter line) CEF0.

The four sets of data on common emitter lines CEF0, CEF1, CEF4 and CEF5 are multiplexed by a multiplex (collector dot type) circuit MX20 (corresponding to PX2 of FIG. 22) and are then outputted to a common data bus (2nd common collector line) CCS0.

The data on 2nd common collector lines CCS0 and CCS1 are multiplexed by a multiplex (emitter dot type) circuit MX30 (corresponding to PX3 of FIG. 22) and are then outputted to a common data bus (2nd common emitter line) CES0.

The two sets of signals on 2nd common emitter line CES0 and CES1 are multiplexed by a multiplex (collector dot type) circuit MPX (corresponding to PX4 of FIG. 22) and are then outputted to a main sense amplifier MSA.

The above description has been given with respect to the block (B00) which is farthest one from the main sense amplifier MSA. However, with respect to the block (e.g., B30) which is the nearest one to the main sense amplifier MSA, the same data are also inputted to the main sense amplifier MSA through the multiplex. Therefore, the signal path is divided with the length thereof into short ones and also the difference between the path lengths of the data buses due to the difference in the blocks does not occur.

Figure 24:
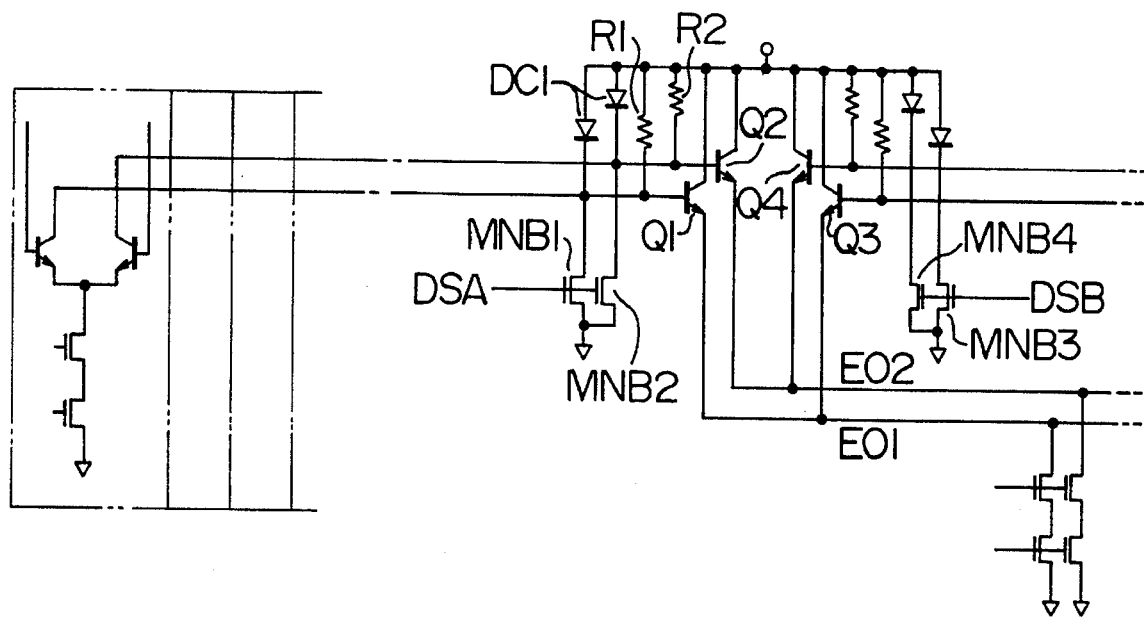
FIG. 24 is a schematic circuit diagram showing the arrangement of an embodiment of the emitter follower type multiplex circuit of the present invention including a base voltage control circuit.

FIG. 24 is a schematic circuit diagram showing the arrangement of another embodiment of a base potential control circuit of the present invention. In the non-selection state, a "High" level signal as a non-selection signal is applied to gates of MOS transistors MNB1 and MNB2, whereby the base potential can be lowered to a non-selection level (a potential less than that of a base connected to a selected data bus line) and the base potential control for the multiplex can be performed. Then, the following technical procedure will be considered for attaining the less power consumption and the high speed operation. That is, for the purpose of preventing the base potential from being lowered to a level less than it needs, clamping diodes DC1 are provided in parallel with load resistors R1 and R2, respectively.

Figure 25:
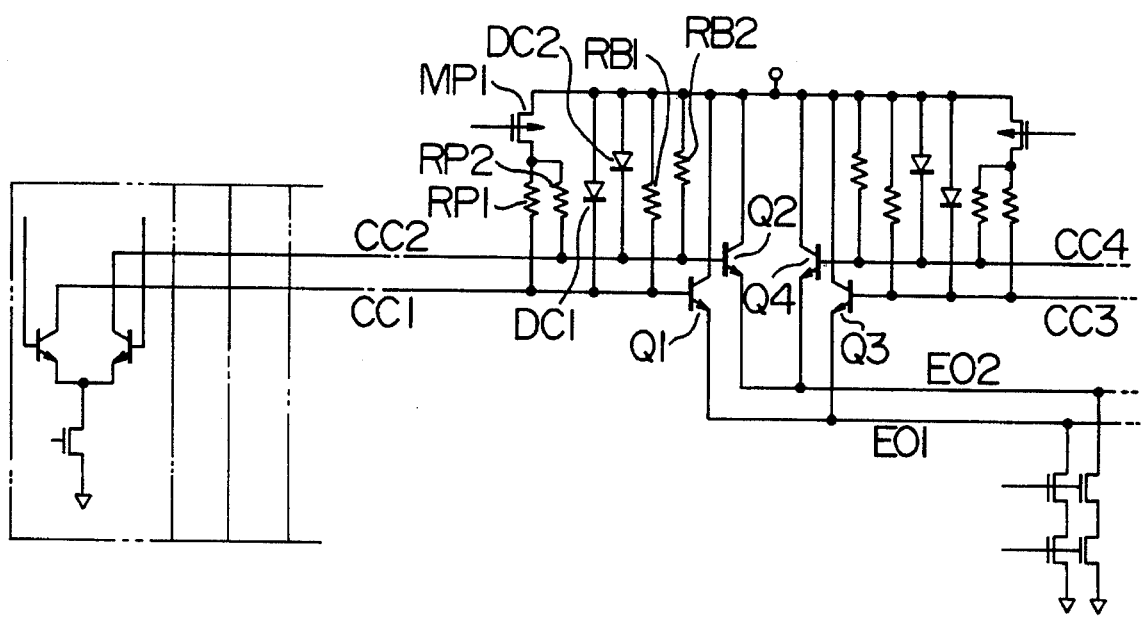
FIG. 25 is a schematic circuit diagram showing the arrangement of a modified example of the emitter follower type multiplex circuit of the present invention including a base voltage control circuit.

FIG. 25 is a schematic circuit diagram showing the arrangement of still another embodiment of the base potential control circuit of the present invention. The present base potential control circuit is made up of clamping diodes DC1 and DC2 which are provided for preventing the base potential from being lowered to a level less than that obtained by subtracting Vbe from the potential of the high potential power source, a MOS transistor MP1, and load resistors RP1 and RP2 for setting the base potential in the selection state, and load resistors RB1 and RB2 for setting the base potential in the non-selection state. The operation thereof is as follows. In the selection, the MOS transistor MP1 is turned on, and the base potential is set to the selection level by the voltage drops due to the on resistance of the MOS transistor MP1, and the load resistors RP1 and RP2 connected in series to the MOS transistor MP1. In the non-selection, the MOS transistor MP1 is turned off, and the base potential is set to a level lower than that of the base potential in the selection by the voltage drops due to the resistors RB1 and RB2 having a larger resistance value than the sum of the on resistance of the MOS transistor MP1 and the resistance value of the load resistor RP1 connected in series therewith. Thus, the control of the base potential can be performed.

Figure 26:
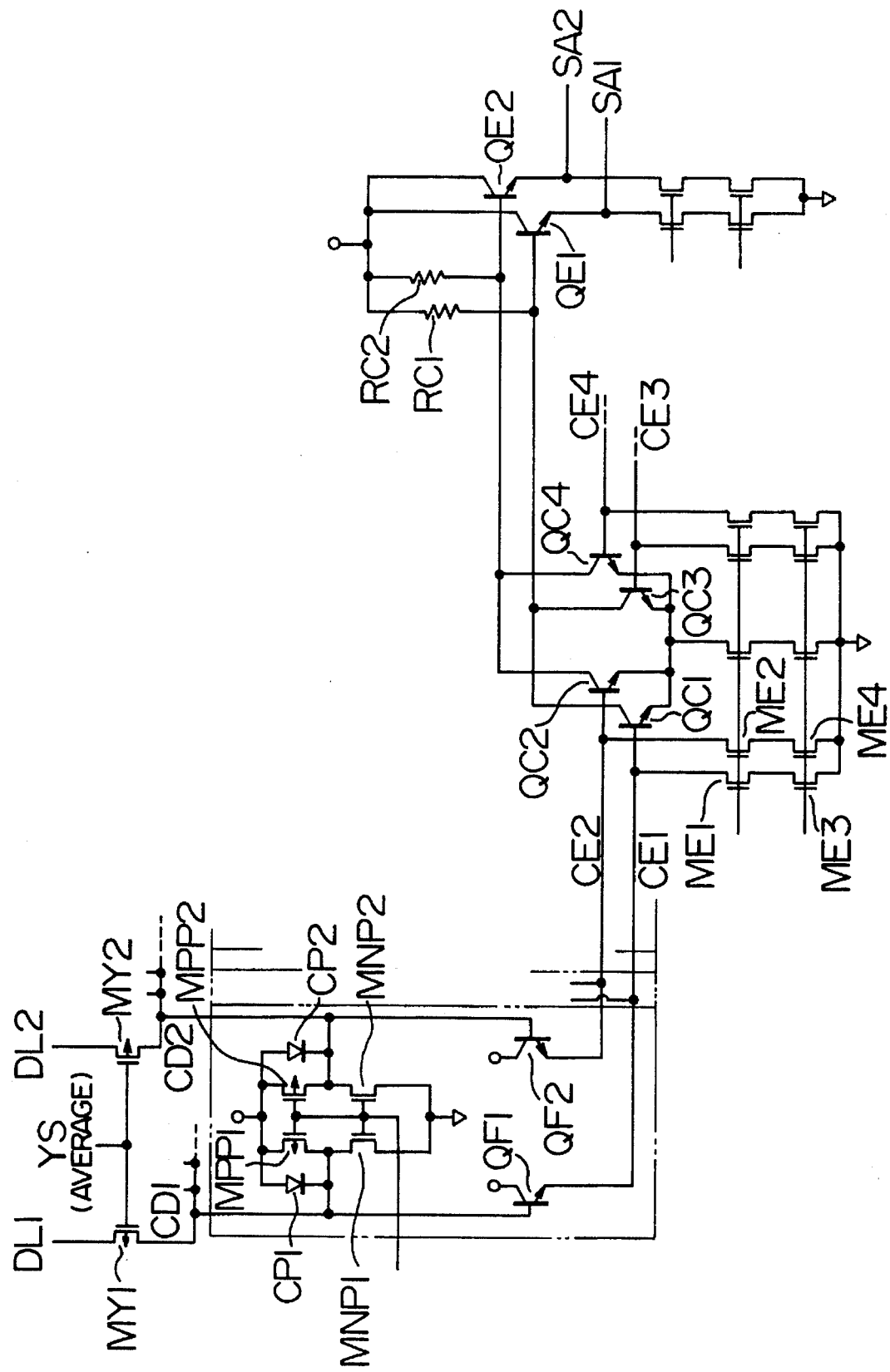
FIG. 26 is a schematic circuit diagram useful in explaining a method of dividing a data bus which employs the multiplex circuit of the present invention.

FIG. 26 is a schematic circuit diagram useful in explaining an embodiment of a method of dividing a data bus using the multiplex circuit of the present invention. Data lines DL1 and DL2 for transferring therethrough data from a memory cell are connected to common data lines CD1 and CD2 through transfer MOS transistors MY1 and MY2, respectively. With the data on CD1 and CD2, the signals on the plurality of data lines are multiplexed by the plurality of transfer MOS transistors. The description will subsequently be given with respect to a method of multiplexing data on the common data lines. For arranging a circuit by which the potentials of the common data lines are controlled in such a way as to be on the "High" level in the selection while being on the "Low" level in the non-selection, MOS transistors for pull-up MPP1 and MPP2, and MOS transistors for pull-down MNP1 and MNP2 are used. That is, as shown in the figure, MPP1 and MNP1, and MMP2 and MNP2 are respectively connected in series to make up two inverters of which outputs are respectively connected to common data lines CD1 and CD2. By this arrangement, each inverter receives a select signal which is on the "Low" level in the selection while being on the "High" level in the non-selection, to output a "High" level signal in the selection and a "Low" level signal in the non-selection, whereby the potentials of the common data lines can be controlled in such a way as to be on the "High" level in the selection while being on the "Low" level in the non-selection. Now, in order to suppress the potential difference between the potential in the selection and that in the non-selection, diodes DP1 and DP2 are provided in parallel to the MOS transistors for pull-up MPP1 and MPP2 to prevent the "Low" level from being lowered to a level less than that obtained by subtracting Vbe from the potential of the high potential power source VCC. The plurality of pairs of common data lines are respectively connected to bases of a plurality of pairs of bipolar transistors QF1 and QF2 having the same number as that of the common data line pairs. Emitters of the bipolar transistors QF1 and QF2 are respectively connected to common emitter lines CE1 and CE2 paired with each other. To the common emitter line pair CE1 and CE2 are respectively connected MOS transistors ME1 and ME2 thereby to make up an emitter follower type multiplex.

Further, by using the collector dot type data multiplexer circuit as described in the embodiment of FIG. 20, the common emitter line pair can be divided.

Figure 27:
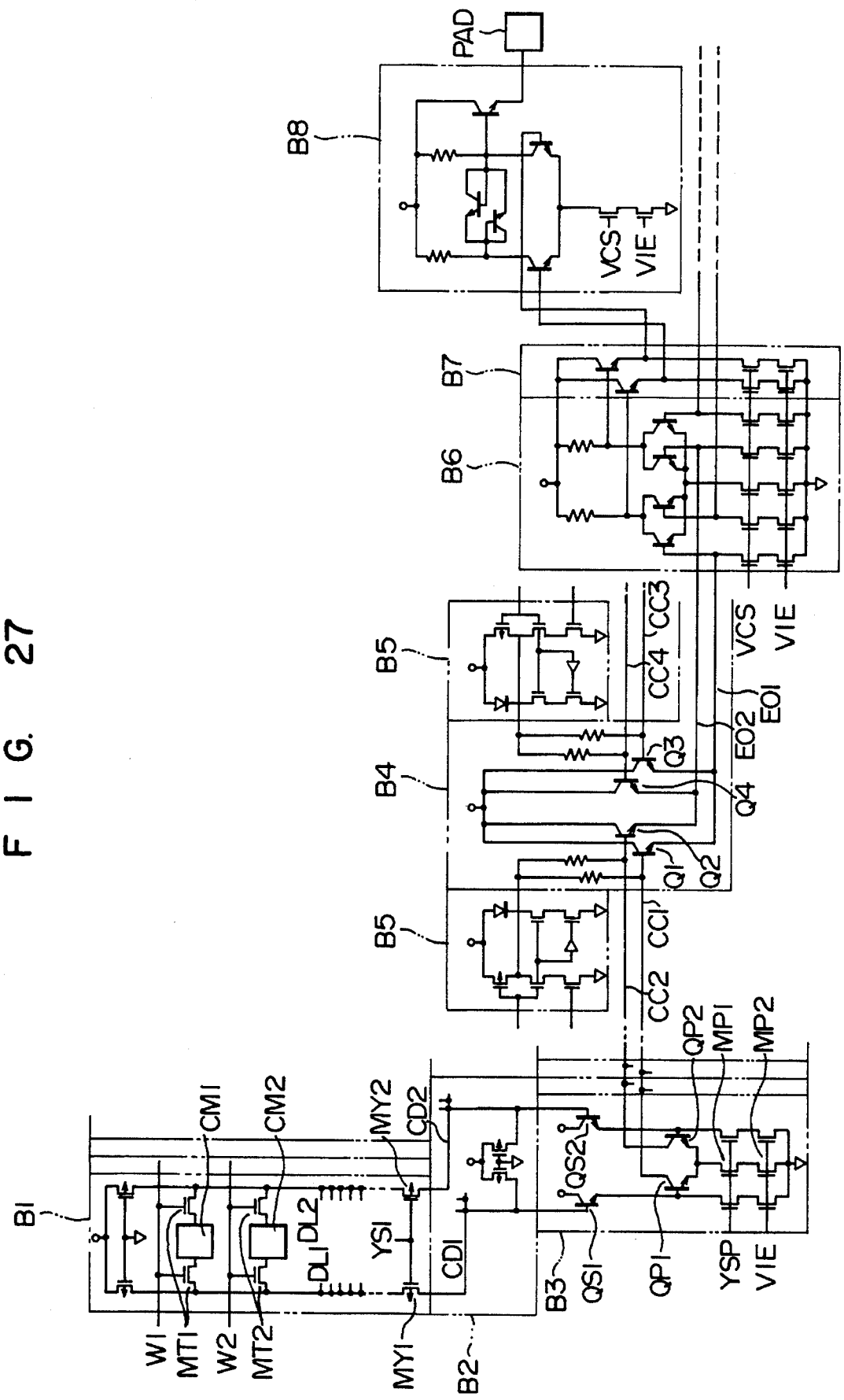
FIG. 27 is a schematic circuit diagram showing the arrangement of a sense system from a memory cell of a semiconductor memory to an output pad in which the multiplex circuit of the present invention is used.

A specific case where the multiplex circuit of the present invention is applied to a BiCMOS SRAM as one example of a semiconductor memory will be shown in FIG. 27 by taking a sense system from a memory cell to an output pad as an example. In the figure, the reference symbol B1 designates a memory array made up of a plurality of memory cells connected to a pair of data lines and correspond to "a column" of the memory array. The reference symbols W1 and W2 designate word lines each of which serves to select "a row" from the plurality of memory arrays arranged in parallel. For example, when the word line W2 is selected, a pair of transfer MOS transistors MT2 in the same memory array are in the on state, and the data in a memory cell CM2 are transferred to data lines DL1 and DL2 through the respective transfer MOS transistors MT2. The reference symbols MY1 and MY2 designate transfer MOS transistors each being called a Y switch. To each of the MOS transistors MY1 and MY2 is inputted a control signal for selecting "a column" from YS1. The reference symbol B2 designates a data bus line called a common data line. To common data lines CD1 and CD2 are connected through the above-mentioned Y switches, a plurality of data lines. In order to transfer the signals on the data lines DL1 and DL2 to the common data lines CD1 and CD2 in the subsequent stage, such a procedure may be taken that a "Low" level signal for selecting a column is inputted to gates YS1 of the Y switches MY1 and MY2 to turn MY1 and MY2 on thereby to connect DL1 and DL2 to CD1 and CD2, respectively. By turning the Y switches corresponding to only "the row" thus selected on, it is possible to multiplex the signals from the plurality of data lines thereby to transfer a set of signals to the common data lines. The reference symbol B3 designates a differential voltage to differential current conversion circuit called a presense amplifier. The reference symbols QS1 and QS2 designate bipolar transistors for level shift provided in the presense amplifier. A differential pair is made up of bipolar transistor QP1 and QP2 and MOS transistors MP1 and MP2 for constituting a current source. The collectors of the bipolar transistors QP1 and QP2 are respectively connected to data bus lines CC1 and CC2 each being called a common collector line. To the common collector lines CC1 and CC2 are connected a plurality of collectors which is the outputs of the above-mentioned presense amplifiers. In order to multiplex the outputs of the plurality of presense amplifiers, the on/off control of the current source of the presense amplifier is performed. If the current source of the presense amplifier which outputs the data to be selected is energized to cause a current to flow therefrom and the other current sources are deenergized, since the differential pair is not operated, multiplexing operation can be performed. The multiplexing operation is realized in such a way that out of the MOS transistors MP1 and MP2 as the current source of the above-mentioned differential pair, MP2 is used as a constant current source, and MP1 is used as a switching device which is operated by a control signal YSP. The reference symbol B4 designates an emitter follower type multiplex circuit. The signals on the common collector lines CC1 and CC2 are inputted to bases of bipolar transistors Q1 and Q2, respectively. The reference symbol B5 designates a base potential control circuit. The operations of the emitter follower type multiplex circuit and the base potential control circuit were already described in the embodiment of FIG. 21, and therefore, the description of such operations will be omitted here for brevity. The outputs of the multiplex circuit B4 are transferred through E01 and E02 and are then inputted to the collector dot type multiplex circuit B6. The operation of the multiplex circuit B6 was already described in the embodiment of FIG. 20, and therefore, the description of such an operation will be omitted here. The data which have been multiplexed and amplified by B6 are inputted to an output buffer B8 through an emitter follower circuit B7. The data which have been subjected to level conversion in the output buffer B8 are outputted to an output pad.

Figure 28:
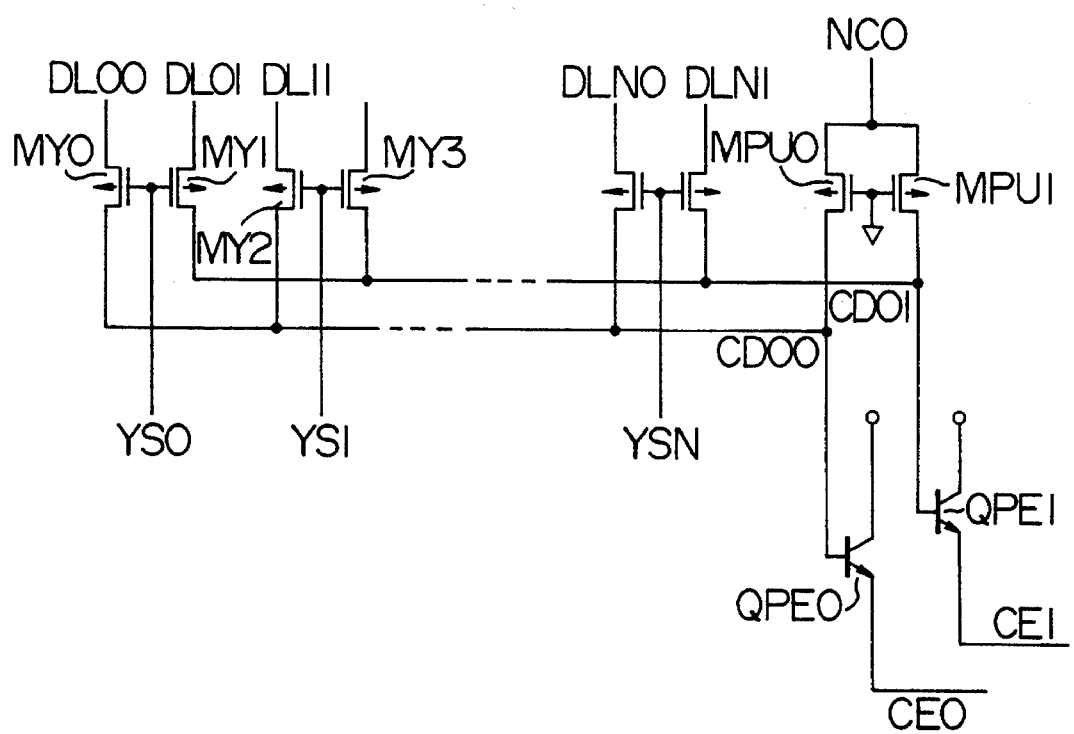
FIG. 28 is a schematic circuit diagram showing the arrangement of an example of a system from a data line of a semiconductor memory to a data line of a presense amplifier in which the multiplex circuit of the present invention is used.

An embodiment in which the present invention is applied to a BiCMOS SRAM as a semiconductor memory will hereinbelow be described on the basis of a data bus from a data line to a presense amplifier (differential voltage to differential current conversion circuit). Common data lines CD00 and CD01 shown in FIG. 28 are data buses through which data on a plurality of data lines DL00, DL01 and the like are multiplexed by a plurality of transfer MOS transistors MY0, MY1 and the like each being called a Y switch. The common data lines CD00 and CD01 are respectively connected to bases of bipolar transistors QPE0 and QPE1 of which collectors are connected to a high potential power source and emitters are connected to common emitter lines CE0 and CE1 as data bus lines in the subsequent stage. Further, common data lines CD00 and CD01 are connected to a control node of which potential is controlled by a selection signal through MOS transistors for pull-up MPU0 and MPU1. The potentials of the common data lines CD00 and CD01 are controlled by the potential at the control node.

Figure 29:
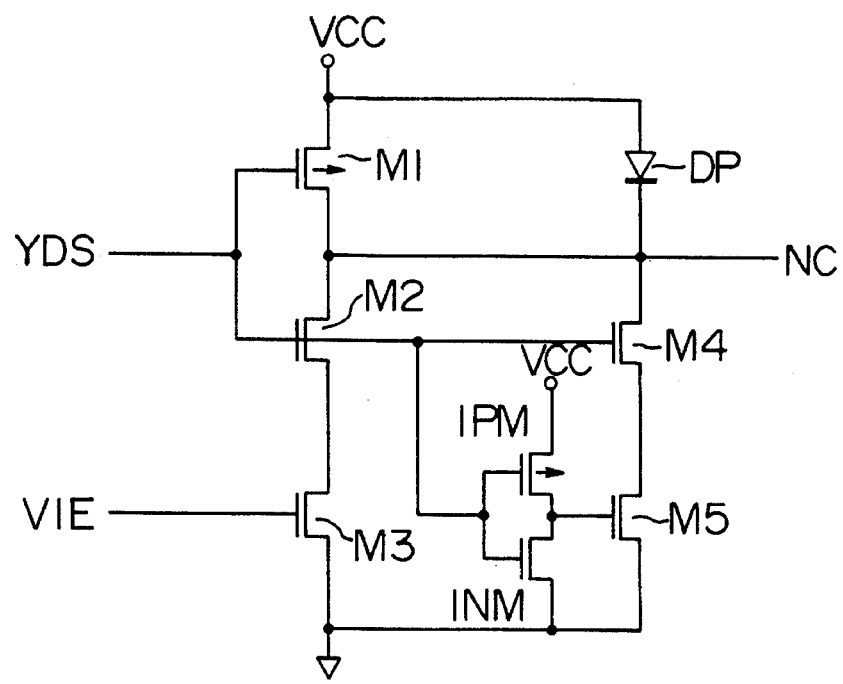
FIG. 29 is a schematic circuit diagram showing the arrangement of a further example of the system from a data line of a semiconductor memory to a data line of a presense amplifier in which the multiplex circuit of the present invention is used.

FIG. 29 is a schematic circuit diagram showing the arrangement of a potential control circuit of the present invention. To YDS is inputted a selection signal as a decode signal and to VIE is connected a power source for a constant current source. Since in the selection state, a low potential signal of a "Low" level as a selection signal is inputted to YDS, a PMOS transistor M1 is turned on while an NMOS transistor M2 is turned off. As a result, a control node NC is connected to a high potential power source. On the other hand, since in the non-selection state, a high potential signal of a "High" level is inputted to YDS, the PMOS transistor M1 is turned off, while the NMOS transistor M2 is turned on. Since an NMOS transistor M3 is normally in the on state, the potential at the control node NC is lowered by the NMOS transistors M2 and M3. However, when the potential at the control node NC is lowered to a level less than the potential of the high potential power source by Vbe, Vbe is applied across a diode DP to turn the diode DP on, so that the potential at the control node NC is not further lowered to a level less than the potential of the high potential power source by Veb. Moreover, the control node NC is connected to a low potential power source through the NMOS transistors M4 and M5, YDS as the selection signal is inputted to the gate of the NMOS transistor M5, and an inversion signal of YDS is inputted to the gate of the NMOS transistor M5. Therefore, current does not steadily flow through the NMOS transistors M4 and M5. The inversion signal is obtained in such a way that the selection signal YDS is inputted to a CMOS inverter made up of a PMOS transistor IPM and an NMOS transistor INM to be inverted. Now, the channel length of the NMOS transistor INM is increased or the channel width thereof is decreased to set the threshold value of the NMOS transistor INM to a high level to increase the delay time when switching over the selection signal YDS from the low potential "Low" level to the high potential "High" level, whereby when switching over the operation from the selection state to the non-selection state, both the NMOS transistors M4 and M5 are transiently in the on state for the delay time of the inverter, and the potential at the control node NC is rapidly lowered to a level less than the potential of the high potential power source by Vbe. In the present potential control circuit, the conductance of the NMOS transistor M3 is decreased to thereby effect a steady-state current in the non-selection state which is small, and at the moment when switching over of the operation from the non-selection state to the selection state is effected, the potential at the control node NC is rapidly lowered to a potential less than that of the high potential power source by Vbe. Thus, the less power consumption is attained.

FIG. 30 shows common emitter lines CE0 and CE1 as data bus lines in the subsequent stage of the common data lines. There is prepared bipolar transistors QPE0 and QPE1 of which bases are connected to common data lines CD00 and CD01, respectively. The collectors of QPE0 and QPE1 are connected to the high potential power source and the emitters thereof are as outputs connected to the common emitter lines. With the potentials of the common data lines, the potential of the common data line to be selective is made to be higher than that of the common data line to be non-selective by the potential control circuit shown in FIG. 29, whereby to the common emitter lines are transferred only the data on the selected common data lines of which potentials are higher than those of the non-selective common data lines. Thus, the multiplexing operation can be performed. The common emitter lines are outputs of a presense amplifier.

The multiplexing operation by the common emitter lines shown in the present embodiment is effective to a high speed access since the parasitic capacitance is small as compared with the multiplexing operation employing the collector dot having the collectors as the outputs of the presense amplifier connected to each other.

Although the present invention has been described by taking the typical embodiments as examples, the present invention is not limited thereto or thereby. That is, it should be noted that the present invention may be applied to a memory or an internal bus mounted in a microprocessor, a large scale computer, a LAN and the like.

According to the multiplex circuit of the present invention, since the operation can be performed even with a source voltage as low as about 2.0 V, the data bus lines such as common collector lines can be divided, and the delay time in the data bus lines can be reduced, the high speed operation of the semiconductor integrated circuit apparatus can be realized. Moreover, there is provided the effect in that the power consumption in the multiplex circuit can be reduced.

We claim:

1. A multiplex circuit used with a semiconductor integrated circuit, comprising a plurality of basic circuits, each of said basic circuits including:

a first power terminal;

a second power terminal;

a bipolar transistor connected between said first and second power terminals;

a signal input terminal coupled to a base terminal of said bipolar transistor; and means responding to a selection state signal and a non-selection state signal, coupled to the base terminal of said bipolar transistor, for controlling a base potential, said means effecting the turning ON of said bipolar transistor, during a selection state, by an input signal supplied to said signal input terminal and effecting the turning OFF of said bipolar transistor, irrespective of a potential level of the input signal supplied to said signal input terminal, during a non-selection state.

2. A multiplex circuit according to claim 1, wherein in each of said plurality of basic circuits, said means for controlling the base potential includes:

means for supplying a base current from said first power terminal to said bipolar transistor; and current drawing means used for turning said bipolar transistor off in the non-selection state.

3. A multiplex circuit according to claim 1, wherein a collector terminal and an emitter terminal of said bipolar transistor are connected to said first power terminal and said second power terminal, respectively, and wherein said means for controlling the base potential includes:

a MOS transistor having a source terminal coupled to said first power terminal, a drain terminal coupled to the base terminal of said bipolar transistor, and a gate terminal coupled to a select signal input terminal; and means coupled to the base terminal of said bipolar transistor, for drawing a current from the base terminal of said bipolar transistor when said MOS transistor is in an off state.

4. A multiplex circuit according to claim 1, wherein a collector terminal and an emitter terminal of said bipolar transistor are connected to said first power terminal and said second power terminal, respectively, and wherein said means for controlling the base potential includes:

a MOS transistor having a source coupled to said first power terminal, a drain terminal coupled to a control node, and a gate terminal coupled to a select input terminal;

a first resistor coupled between said signal input terminal and said control node; and means coupled to said control node for drawing current from said control node when said MOS transistor is in an off state.

5. A multiplex circuit according to claim 4, wherein each of the first power terminals is supplied with a first power source potential, each of the second power terminals is supplied with a second power source potential, lower than that of said first power source, through a current source circuit, and wherein an output terminal is effected at a connection between said second power terminal and said current source circuit.

6. A multiplex circuit according to claim 4, wherein said first resistor provided in each of said plurality of basic circuits is constructed of a MOS transistor.

7. A multiplex circuit according to claim 4, wherein each of said plurality of basic circuits includes a diode having an anode connected to said first power terminal and a cathode connected to said control node.

8. A multiplex circuit according to claim 4, wherein each of said plurality of basic circuits includes a diode having an anode connected to said first power terminal and a cathode connected to the base terminal of said bipolar transistor.

9. A multiplex circuit according to claim 4, wherein each of said plurality of basic circuits includes a second resistor connected between said first power terminal and said control node.

10. A multiplex circuit according to claim 7, wherein each of said plurality of basic circuits includes a second resistor which is provided between said first power terminal and said control node and is connected in series to said MOS transistor.

11. A multiplex circuit according to claim 9, wherein each of said plurality of basic circuits includes a third resistor which is provided between said first power terminal and said control node and is connected in series to said MOS transistor.

12. A multiplex circuit according to claim 4, wherein said current drawing means provided in each of said plurality of basic circuits includes a MOS transistor.

13. A multiplex circuit according to claim 4, wherein said current drawing means provided in each of said plurality of basic circuits includes first and second MOS transistors connected in series, said first MOS transistor is turned on and off by an input signal supplied from said select input terminal, and said second MOS transistor is biased normally to be in an on state.

14. A multiplex circuit according to claim 4, wherein said current drawing means provided in each of said plurality of basic circuits includes first and second MOS transistors connected in series, a gate terminal of said first MOS transistor is directly connected to said select input terminal and a gate terminal of said second MOS transistor is connected through an inverter to said select input terminal.

15. A multiplex circuit according to claim 4, wherein said current drawing means provided in each of said plurality of basic circuits includes a bipolar transistor.

16. A multiplex circuit according to claim 5, wherein said current source circuit includes a bipolar transistor.

17. A multiplex circuit according to claim 5, wherein said current source circuit includes a MOS transistor.

18. A multiplex circuit according to claim 5, wherein said current source circuit includes a first and second MOS transistors connected in series, said first MOS transistor is turned on and off by an input signal supplied from said select input terminal, and said second MOS transistor is biased to normally be in an on state.

19. A multiplex circuit used with a semiconductor integrated circuit, comprising a plurality of basic circuits, each of said basic circuits including:

one pair of bipolar transistors each of which is connected between first and second power terminals;

one pair of signal input terminals coupled to respective base terminals of said one pair of bipolar transistors; and means responding to a selection state signal and a non-selection state signal, coupled to the base terminals of said one pair of bipolar transistors, for controlling a base potential thereof, respectively, said means effecting the turning ON of said one pair of bipolar transistors, during a selection state, by one pair of input signals supplied from said one pair of signal input terminals and effecting the turning OFF of said one pair of bipolar transistors, irrespective of potential levels of said one pair of input signals, during a non-selection state.

20. A multiplex circuit according to claim 19, wherein said one pair of input signals represent signals outputted from a presense amplifier provided in a semiconductor memory circuit.

21. A multiplex circuit used with a semiconductor integrated circuit, comprising:

n pairs of bipolar transistors connected between first and second power terminals, respectively, where n is an integer greater than 1, collector terminals of one pair of the bipolar transistors of said n pairs of bipolar transistors being connected in common at a first common connection acting as a first output terminal, collector terminals of other pairs of the bipolar transistors being connected in common at a second common connection acting as a second output terminal, and emitter terminals of said n pairs of bipolar transistors being connected in common at a third common connection;

a first resistor coupled between said first power terminal and said first common connection;

a second resistor coupled between said first power terminal and said second common connection;

a first current source coupled between said third common connection and said power terminal;

n pairs of signal input terminals, one pair of the signal input terminals of said n pairs of signal input terminals being coupled to respective base terminals of said one pair of bipolar transistors, respectively, other pairs of the signal input terminals being coupled to base terminals of said other pairs of bipolar transistors, respectively;

2n second current sources coupled between the base terminals of the bipolar transistors of said n pairs of bipolar transistors and said second power terminal, respectively; and a common select input terminal used for controlling on/off operation of said first current source and said 2n second current sources, wherein with n pairs of input signals inputted to said n pairs of input terminals, one pair of the input signals which are selected are different in potential from each other, and remaining pairs of the input signals which are not selected are equal in potential to one another.

22. A multiplex circuit used with a semiconductor integrated circuit, comprising:

n pairs of first bipolar transistors connected between first and second power terminals, respectively, where n is an integer greater than 1, collector terminals of one pair of the first bipolar transistors of said n pairs of first bipolar transistors being connected in common at a first common connection, collector terminals of other pairs of the first bipolar transistors being connected in common at a second common connection, and emitter terminals of said n pairs of first bipolar transistors being connected in common at a third common connection;

a second bipolar transistor having a collector terminal connected to said first power terminal and a base connected to said first common connection;

a third bipolar transistor having a collector terminal connected to said first power terminal and a base terminal connected to said second common connection;

a first resistor coupled between said first power terminal and said first common connection;

a second resistor coupled between said first power terminal and said second common connection;

a first current source coupled between said third common connection and said second power terminal;

n pairs of signal input terminals, one pair of the signal input terminals of said n pairs of signal input terminals being coupled to base terminals of said one pair of first bipolar transistors, respectively, and other pairs of the signal input terminals being coupled to base terminals of said other pairs of first bipolar transistors, respectively;

2n second current sources coupled between said base terminals of said n pairs of first bipolar transistors and said second power terminal, respectively;

a third current source coupled between said emitter terminals of said second and third bipolar transistors and said second power terminal, respectively; and a common select input terminal used for controlling on/off operation of said first current source, said 2n second current sources and said third current source, wherein with n pairs of input signals inputted to said n pairs of input terminals, one pair of the input signals which are selected are different in potential from each other, and remaining pairs of the input signals which are not selected are equal in potential to one another.

23. A multiplex circuit according to claim 21, wherein each of said first and second current sources includes a MOS transistor.

24. A multiplex circuit according to claim 22, wherein each of said first, second and third current sources includes a MOS transistor.

* * * * *